(12) United States Patent
Chiu

(10) Patent No.: US 10,804,184 B2
(45) Date of Patent: Oct. 13, 2020

(54) SEMICONDUCTOR DEVICE AND METHOD OF MANUFACTURING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/281,360

(22) Filed: Feb. 21, 2019

(65) Prior Publication Data

US 2020/0176358 A1 Jun. 4, 2020

Related U.S. Application Data

(60) Provisional application No. 62/773,602, filed on Nov. 30, 2018.

(51) Int. Cl.
*H01L 23/48* (2006.01)
*H01L 23/52* (2006.01)
*H01L 23/40* (2006.01)
*H01L 21/768* (2006.01)

(52) U.S. Cl.
CPC ...... *H01L 23/481* (2013.01); *H01L 21/76897* (2013.01); *H01L 21/76898* (2013.01)

(58) Field of Classification Search
CPC ............ H01L 23/481; H01L 21/76898; H01L 21/486; H01L 21/76877; H01L 21/76831; H01L 21/76897; H01L 23/528; H01L 21/76832; H01L 21/76885; H01L 21/784; H01L 21/823475
USPC ...................................................... 257/774
See application file for complete search history.

(56) References Cited

U.S. PATENT DOCUMENTS

| 8,252,659 B2 | 8/2012 | Huyghebaert et al. |
| 8,476,769 B2 | 7/2013 | Chen et al. |
| 9,048,233 B2 | 6/2015 | Wu et al. |
| 2009/0315184 A1* | 12/2009 | Tokitoh ................. H01L 23/522 257/758 |
| 2010/0078776 A1* | 4/2010 | Barth ................ H01L 21/76898 257/659 |
| 2013/0062736 A1 | 3/2013 | Brighton et al. |

FOREIGN PATENT DOCUMENTS

| TW | 201413872 A | 4/2014 |
| TW | 201528347 A | 7/2015 |
| TW | 201546957 A | 12/2015 |

OTHER PUBLICATIONS

Office Action issued in corresponding CN application No. 108109570 dated May 25, 2020 (with partial English translation).

* cited by examiner

*Primary Examiner* — Theresa T Doan
(74) *Attorney, Agent, or Firm* — Muncy, Geissler, Olds & Lowe, P.C.

(57) ABSTRACT

The present disclosure provides a semiconductor device and a method of manufacturing the same. The semiconductor device includes a semiconductor substrate, a restraint layer, a plurality of contact plugs, and a plurality of through silicon vias. The restraint layer is disposed on the semiconductor substrate, and the contact plugs are inserted into the restraint layer. The through silicon vias extend from a bottom surface of the semiconductor substrate to a front surface opposite to the back surface and the through silicon vias are in contact with the contact plugs, respectively.

9 Claims, 27 Drawing Sheets

SEMICONDUCTOR DEVICE AND METHOD OF MANUFACTURING THE SAME

PRIORITY CLAIM AND CROSS-REFERENCE

This application claims the priority benefit of U.S. provisional application Ser. No. 62/773,602, filed on Nov. 30, 2018. The entirety of the above-mentioned patent application is hereby incorporated by reference herein and made a part of this specification.

TECHNICAL FIELD

The present disclosure relates to a semiconductor device and a method of manufacturing the same, and more particularly, to a semiconductor device with an interconnection structure and a method of manufacturing the same.

DISCUSSION OF THE BACKGROUND

Two-dimensional (2D) approaches have been traditionally applied for IC integration. Continuous demand for new IC packages that can fulfill the consumer market requirements for increased functionality and performance with reduced size and cost has driven the semiconductor industry to develop more innovative packaging, using vertical, three-dimensional (3D) integration.

General advantages of 3D packaging technologies include form factor miniaturization (reduction of size and weight), integration of heterogeneous technologies in a single package, replacement of lengthy 2D interconnects with short vertical interconnects, and the reduction of power consumption.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a semiconductor substrate, a restraint layer, a plurality of contact plugs, and a plurality of through silicon vias. The restraint layer is disposed on the semiconductor substrate, and the contact plugs are inserted into the restraint layer. The through silicon vias extend from a bottom surface of the semiconductor substrate to a front surface opposite to a back surface and the through silicon vias are in contact with the contact plugs, respectively.

In some embodiments, an aperture of each of the plurality of through silicon vias gradually increases at positions of increasing distance from the contact plugs.

In some embodiments, the semiconductor device further includes a dielectric layer encircling the contact plugs.

In some embodiments, a top surface of each of the plurality of contact plugs is coplanar with an upper surface of the dielectric layer.

In some embodiments, the semiconductor device further includes a semiconductor component disposed on the semiconductor substrate and surrounded by the dielectric layer.

In some embodiments, each of the plurality of contact plugs includes a first conductive plug disposed in the dielectric layer, and a first barrier layer disposed between the first conductive plugs and the dielectric layer.

In some embodiments, each of the plurality of through silicon vias includes a second conductive plug disposed in the semiconductor substrate, and a second barrier layer disposed between the semiconductor substrate and the second conductive plugs.

In some embodiments, each of the plurality of through silicon vias further includes a seed layer disposed between the second barrier layer and the second conductive plug.

In some embodiments, an end surface of each of the plurality of through silicon vias is coplanar with the back surface.

Another aspect of the present disclosure provides a method of manufacturing a semiconductor device. The method includes steps of providing a semiconductor substrate; disposing a restraint layer on the semiconductor substrate; forming a plurality of openings in the restraint layer to expose the semiconductor substrate; depositing a dielectric layer on the restraint layer and in the openings; forming a plurality of trenches in the dielectric layer to expose the semiconductor substrate; depositing a first conductive material in the trenches; forming a plurality of through-holes in the semiconductor substrate to expose the first conductive material; and depositing a second conductive material in the through-holes.

In some embodiments, an aperture of the openings is smaller than an aperture of each of the plurality of trenches.

In some embodiments, an aperture of each of the plurality of through-holes gradually increases at positions of increasing distance from the restraint layer.

In some embodiments, portions of the restraint layer are exposed to the trenches.

In some embodiments, the method further includes steps of depositing a first barrier layer on the dielectric layer and in the trenches before the deposition of the first conductive material; and performing a first planarizing process to remove portions of the first barrier layer and the first conductive material above an upper surface of the dielectric layer after the deposition of the first conductive material.

In some embodiments, the method further includes depositing a second barrier layer on a back surface of the semiconductor substrate and in the through-holes; depositing a seed layer on the second barrier layer before the depositing of the second conductive material; and performing a second planarizing process to remove portions of the second barrier layer, the seed layer, and the second conductive material from the back surface after the deposition of the second conductive material.

In some embodiments, the method further includes a step of forming a semiconductor component before the deposition of the restraint layer.

In some embodiments, the trenches are formed using a self-aligned contact (SAC) etching process that etching through the dielectric layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
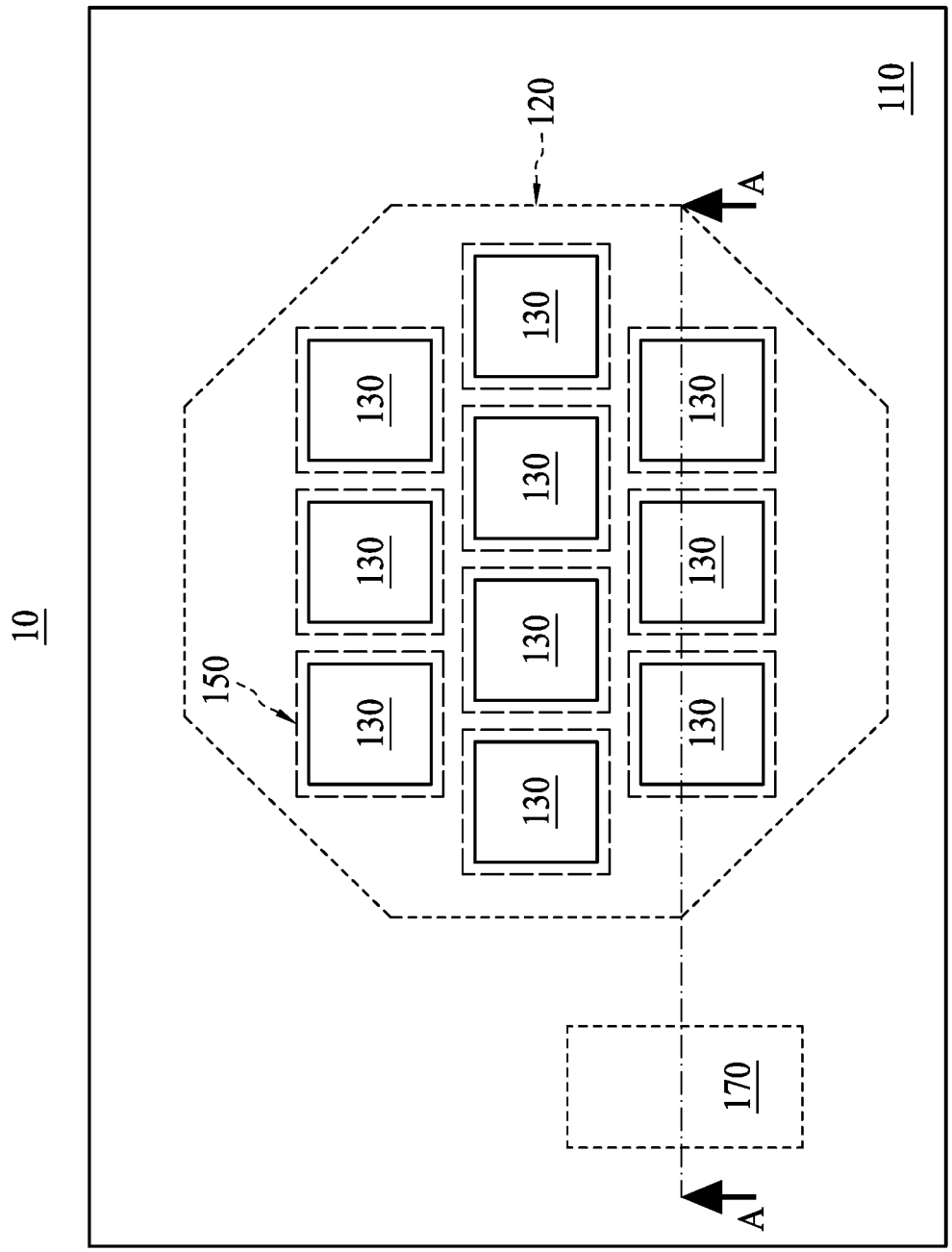
FIG. 1 is a top view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
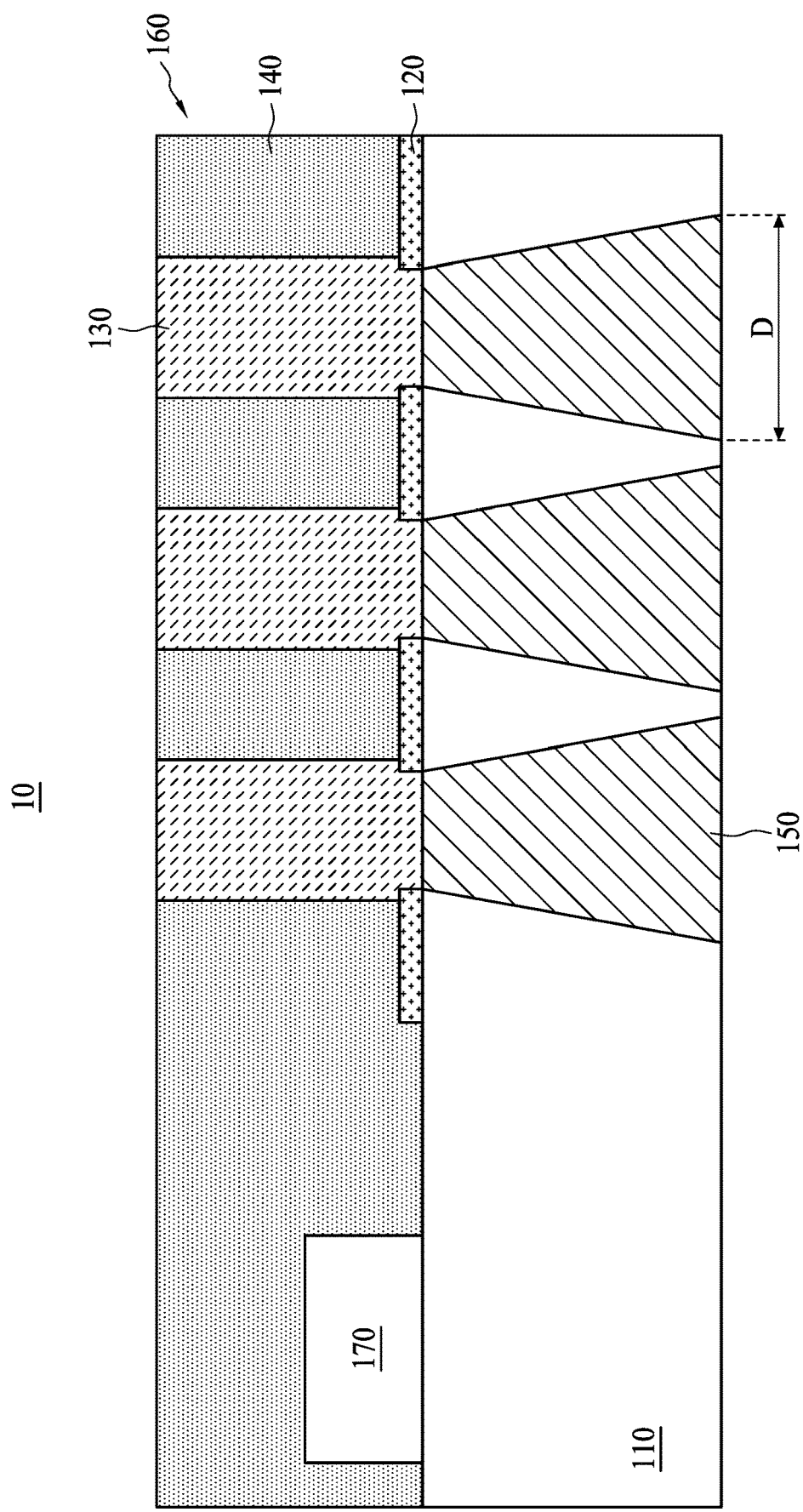
FIG. 2 is a cross-sectional view taken along the line A-A illustrated in FIG. 1.

FIG. 1 is a top view of a semiconductor device 10 in accordance with some embodiments of the present disclosure, and FIG. 2 is a cross-sectional view taken along the line A-A illustrated in FIG. 1. Referring to FIGS. 1 and 2, the semiconductor device 10 includes a semiconductor substrate 110, a restraint layer 120 disposed on the semiconductor substrate 110, a plurality of contact plugs 130 inserted into the restraint layer 120, a dielectric layer 140 encircling the contact plugs 130, and a plurality of through silicon vias 150 disposed in the semiconductor substrate 110 and in contact with the contact plugs 130, respectively. In some embodiments, the restraint layer 120, the contact plugs 130, the dielectric layer 140, and the through silicon vias 150 collectively form an interconnection structure 160.

In some embodiments, the semiconductor device 10 further includes a semiconductor component 170 disposed on the semiconductor substrate 110 and surrounded by the dielectric layer 140. In some embodiments, the interconnection structure 160 is formed after the creating of the semiconductor component 170. In some embodiments, an aperture D of each of the through silicon vias 150 gradually increases at positions of increasing distance from the restraint layer 120. In some embodiments, the restraint layer 120 has an octagonal shape when viewed in a plan view. In some embodiments, the contact plugs 130 and the through silicon vias 150 have a rectangular shape when viewed in the plan view.

Figure 3:
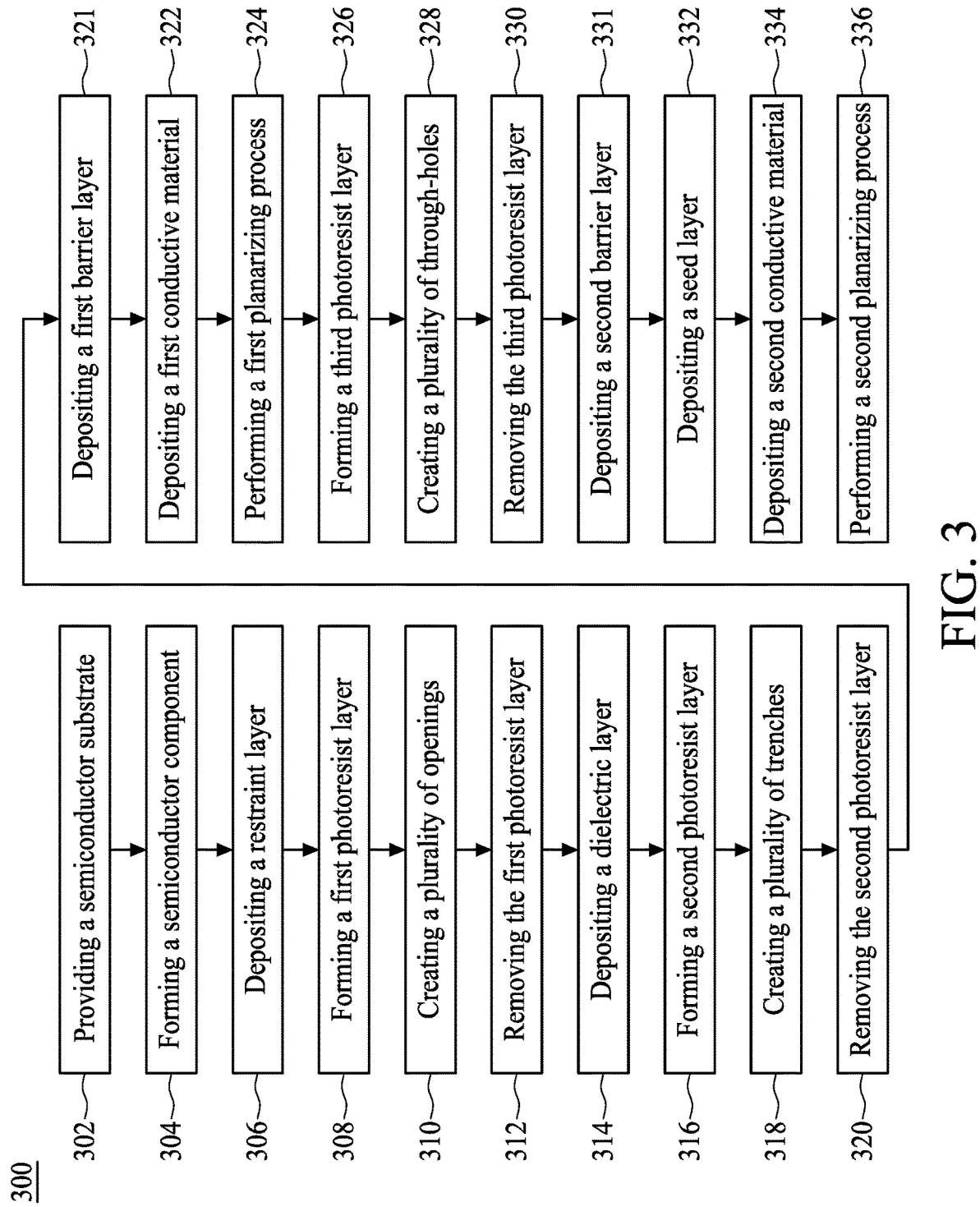
FIG. 3 is a flow diagram illustrating a method of manufacturing semiconductor devices in accordance with some embodiments of the present disclosure.

FIG. 3 is a flow diagram illustrating a method 300 of manufacturing a semiconductor device 10 in accordance with some embodiments of the present disclosure. FIGS. 4 to 19 are schematic diagrams illustrating various fabrication stages constructed according to the method 300 for manufacturing the semiconductor device 10 in accordance with some embodiments of the present disclosure. The stages shown in FIGS. 4 to 19 are also illustrated schematically in the flow diagram in FIG. 3. In the subsequent discussion, the fabrication stages shown in FIGS. 4 to 19 are discussed in reference to the process steps in FIG. 3.

Figure 4:
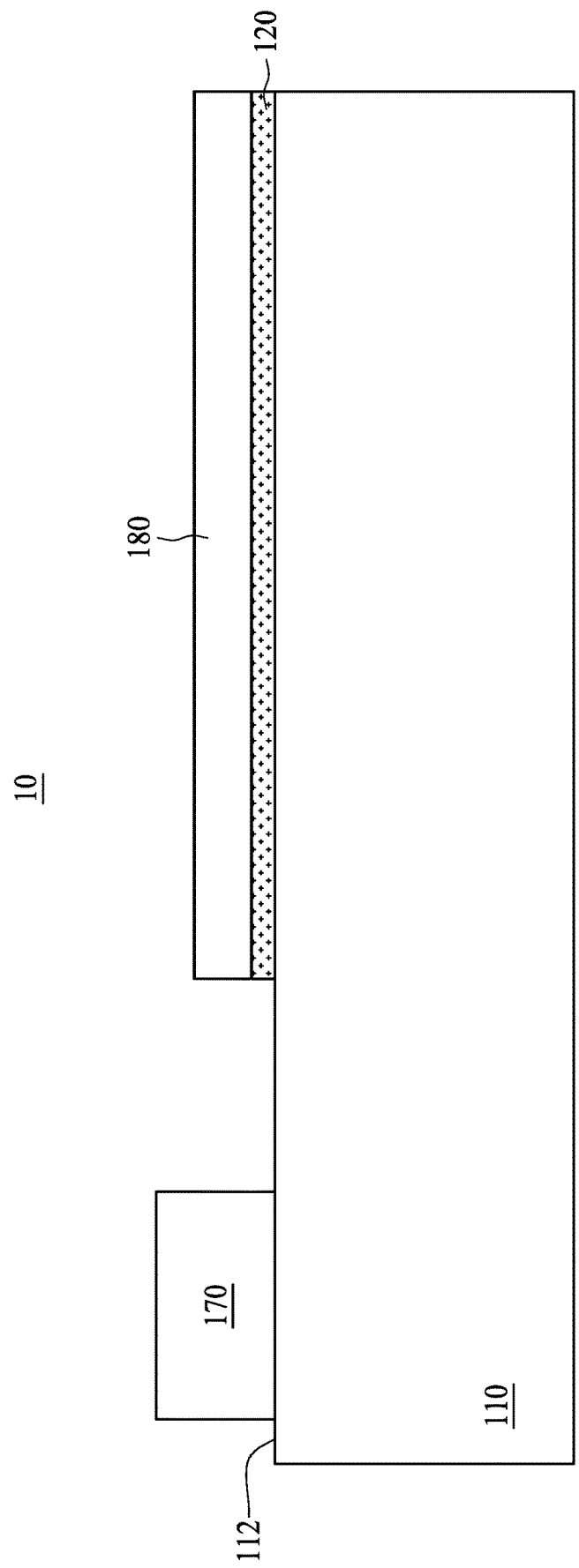
FIGS. 4 and 5 illustrate cross-sectional views of intermediate stages in the formation of a semiconductor device in accordance with some embodiments of the present disclosure.

Referring to FIG. 4, a semiconductor substrate 110 is provided according to a step 302 in FIG. 3. In some embodiments, the semiconductor substrate 110 is a bulk substrate. In some embodiments, examples of the material suitable for the semiconductor substrate 110 include, but are not limited to, silicon, silicon on insulator, silicon on sapphire, and gallium arsenide.

Next, a semiconductor component 170 is formed on the semiconductor substrate 110 according to a step 304 in FIG. 3. In some embodiments, the semiconductor component 170 may be a metal-oxide-semiconductor (MOS) transistor. In some embodiments, the semiconductor component 170 may be formed using conventional process steps.

After the forming of the semiconductor component 170, a restraint layer 120 is deposited on the semiconductor substrate 110 according a step 306 in FIG. 3. In some embodiments, the semiconductor component 170 and the restraint layer 120 are disposed at the same side of the semiconductor substrate 110. In some embodiments, the restraint layer 120 is disposed on a front surface 112 of the semiconductor substrate 110. In some embodiments, a portion of the front surface 112 is exposed to the restraint layer 120 and the semiconductor component 170. In some embodiments, the restraint layer 120 may be separated from the semiconductor component 170. In some embodiments, the restraint layer 120 includes nitride. In some embodiments, the restraint layer 120 may be made of silicon nitride (SiN). In some embodiments, the restraint layer 120 is formed using a chemical vapor deposition (CVD) process.

Figure 5:
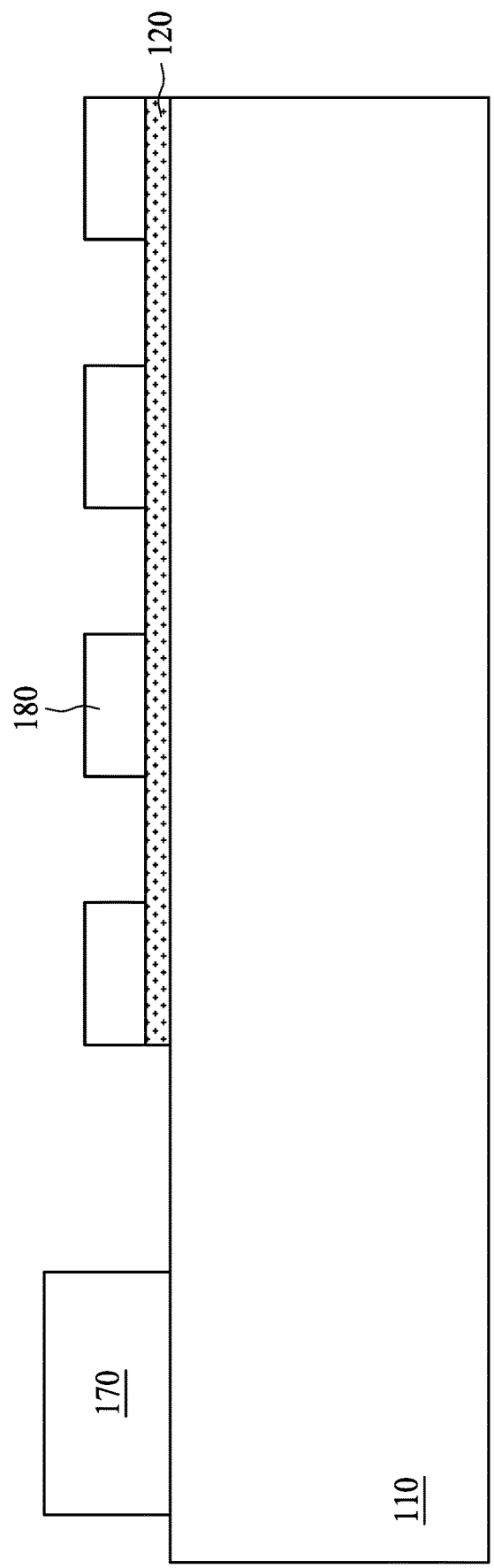

Next, a first photoresist layer 180 is formed on the restraint layer 120 according to a step 308 in FIG. 3. In some embodiments, the first photoresist layer 180 fully covers the restraint layer 120. The first photoresist layer 180 is then patterned to expose a portion of the restraint layer 120, as shown in FIG. 5.

Figure 6:
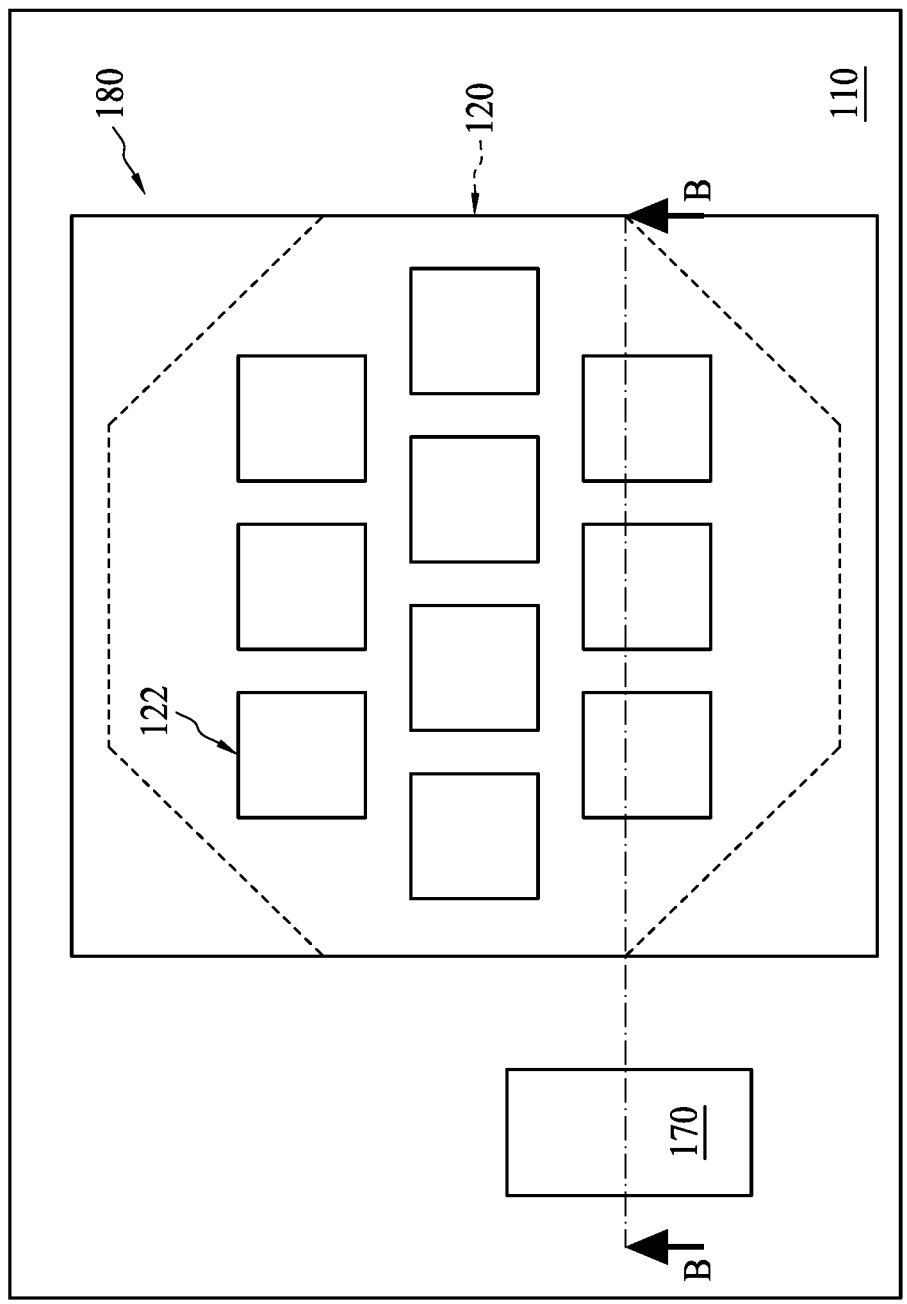
FIG. 6 illustrates a top view of an intermediate stage in the formation of the semiconductor device in accordance with some embodiments of the present disclosure.
Figure 7:
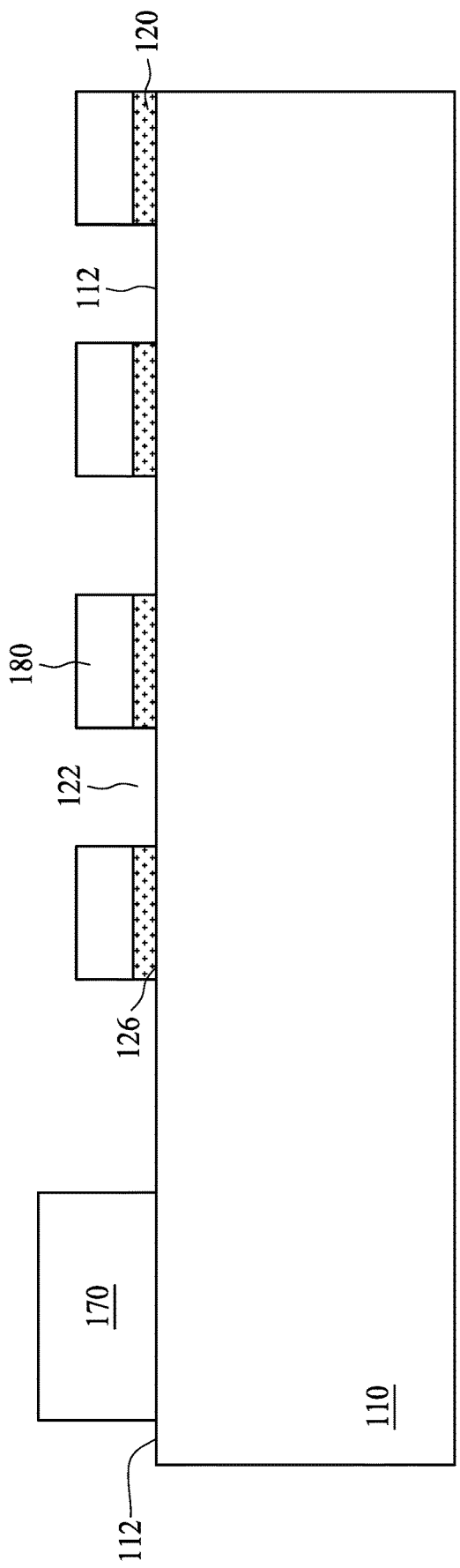
FIG. 7 is a cross-sectional view taken along the line B-B illustrated in FIG. 6.

Referring to FIGS. 6 and 7, in some embodiments, a first patterning process is performed to etch the restraint layer 120 and thus create a plurality of openings 122 in the restraint layer 120 according to a step 310 in FIG. 3. In some embodiments, the openings 122 are formed by removing a portion of the restraint layer 120 exposed through the first photoresist layer 180. In some embodiments, the openings 122 stop at the semiconductor substrate 110. In some embodiments, the openings 122 may be rectangular openings. In some embodiments, the restraint layer 120 is patterned using an etching process, such as a plasma etching process.

Figure 8:
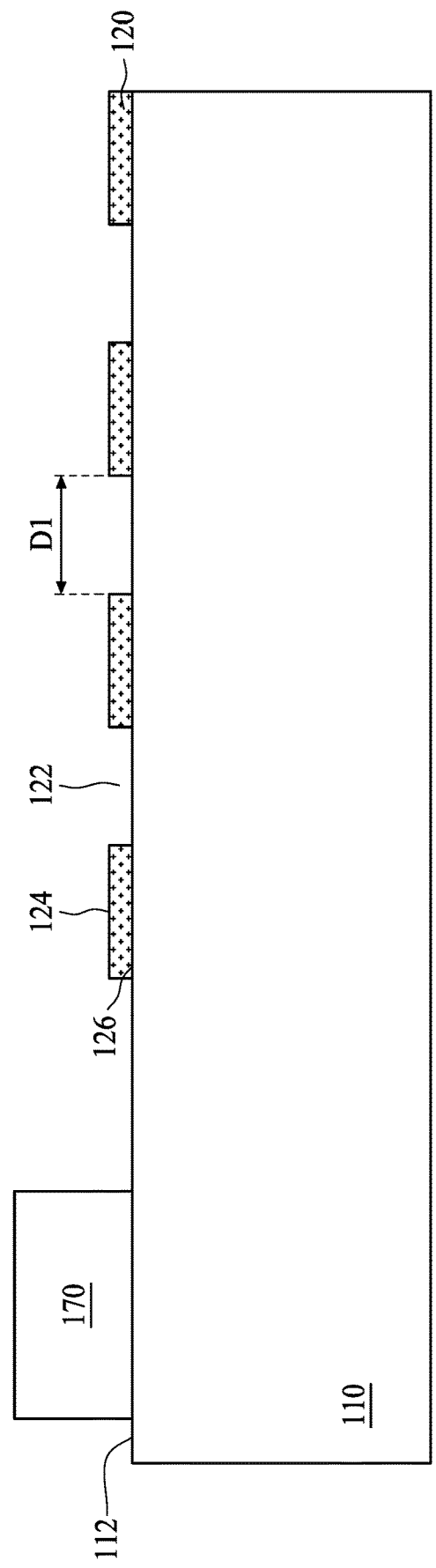
FIGS. 8 to 19 illustrate cross-sectional views of intermediate stages in the formation of the semiconductor device in accordance with some embodiments of the present disclosure.

Referring to FIG. 8, the remaining first photoresist layer 180 is then removed, for example, through an ashing process according to a step 312 in FIG. 3. In some embodiments, the openings 122 extend from a top surface 124 of the restraint layer 120 to a bottom surface 126 of the restraint layer 120 opposite to the top surface 124. In some embodiments, a portion of the front surface 112 is exposed to the openings 122. In some embodiments, each of the openings 122 has an aperture D1. In some embodiments, the aperture D1 is less than 10 µm.

Figure 9:
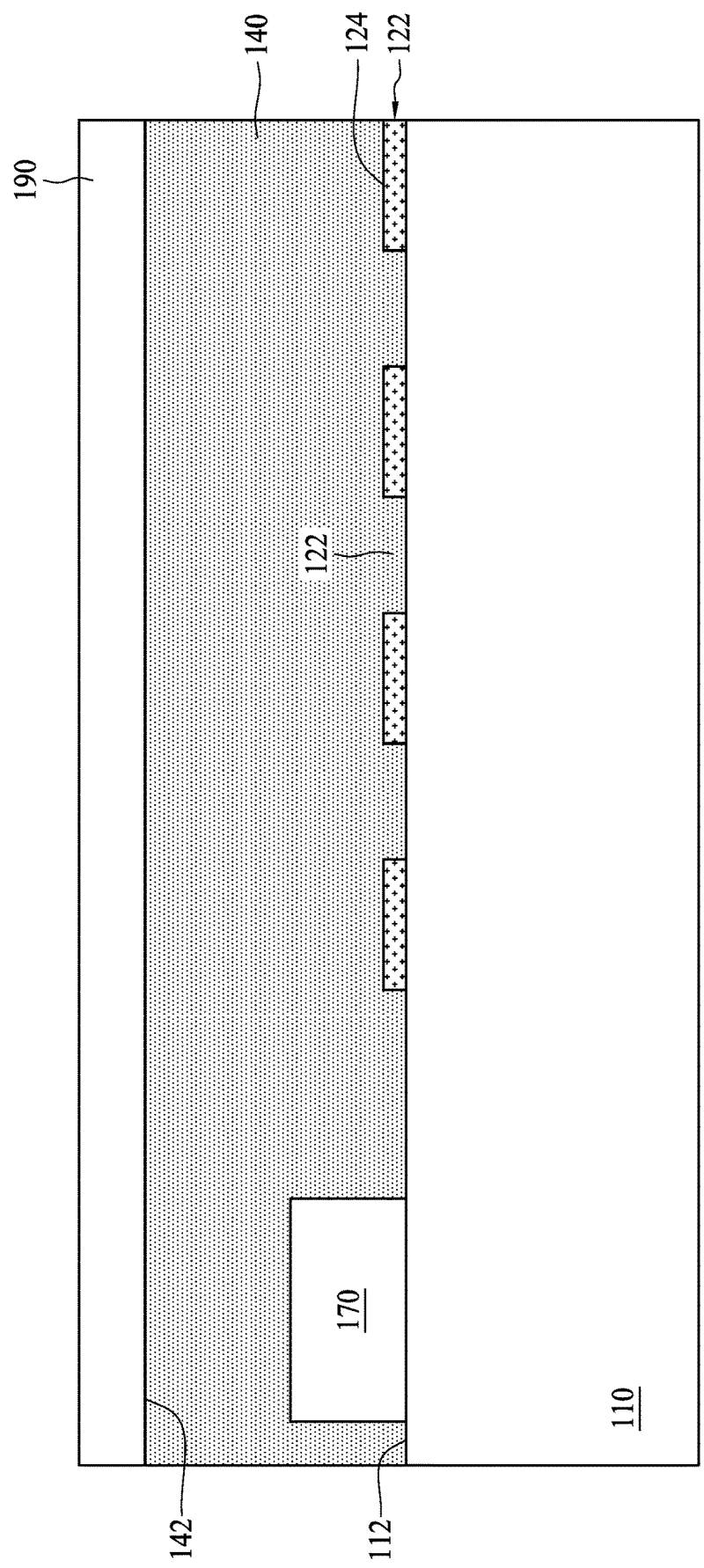

Referring to FIG. 9, in some embodiments, a dielectric layer 140 is disposed on the restraint layer 120 and on the semiconductor component 170 according to a step 314 in FIG. 3. In some embodiments, the dielectric layer 140 fully covers the restraint layer 120 and the semiconductor component 170. In some embodiments, the dielectric layer 140 extends along the top surface 124 and into the openings 122. In some embodiments, the dielectric layer 140 includes oxide. In some embodiments, the dielectric layer 140 may be made of silicon dioxide. In some embodiments, after the deposition of the dielectric layer 140, a polishing process may be performed to obtain a flat upper surface 142 of the dielectric layer 140. In some embodiments, the dielectric layer 140 is formed, for example, using a CVD process or a spin coating process.

Figure 10:
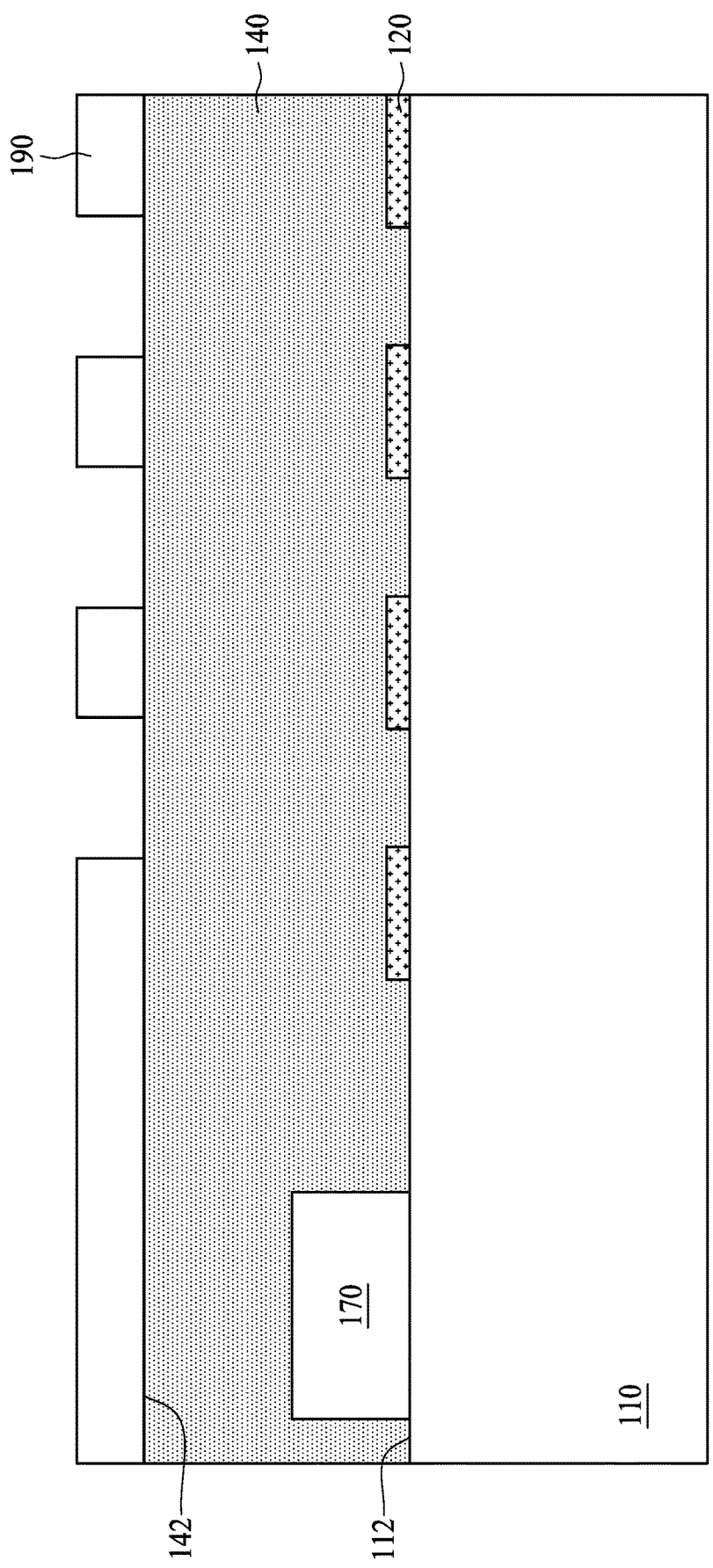

Next, in some embodiments, a second photoresist layer 190 is formed on the dielectric layer 140 according to a step 316 in FIG. 3. The second photoresist layer 190 is then patterned to expose a portion of the dielectric layer 140, as shown in FIG. 10. In some embodiments, the semiconductor component 170 is disposed beneath the remaining second photoresist layer 190.

Figure 11:
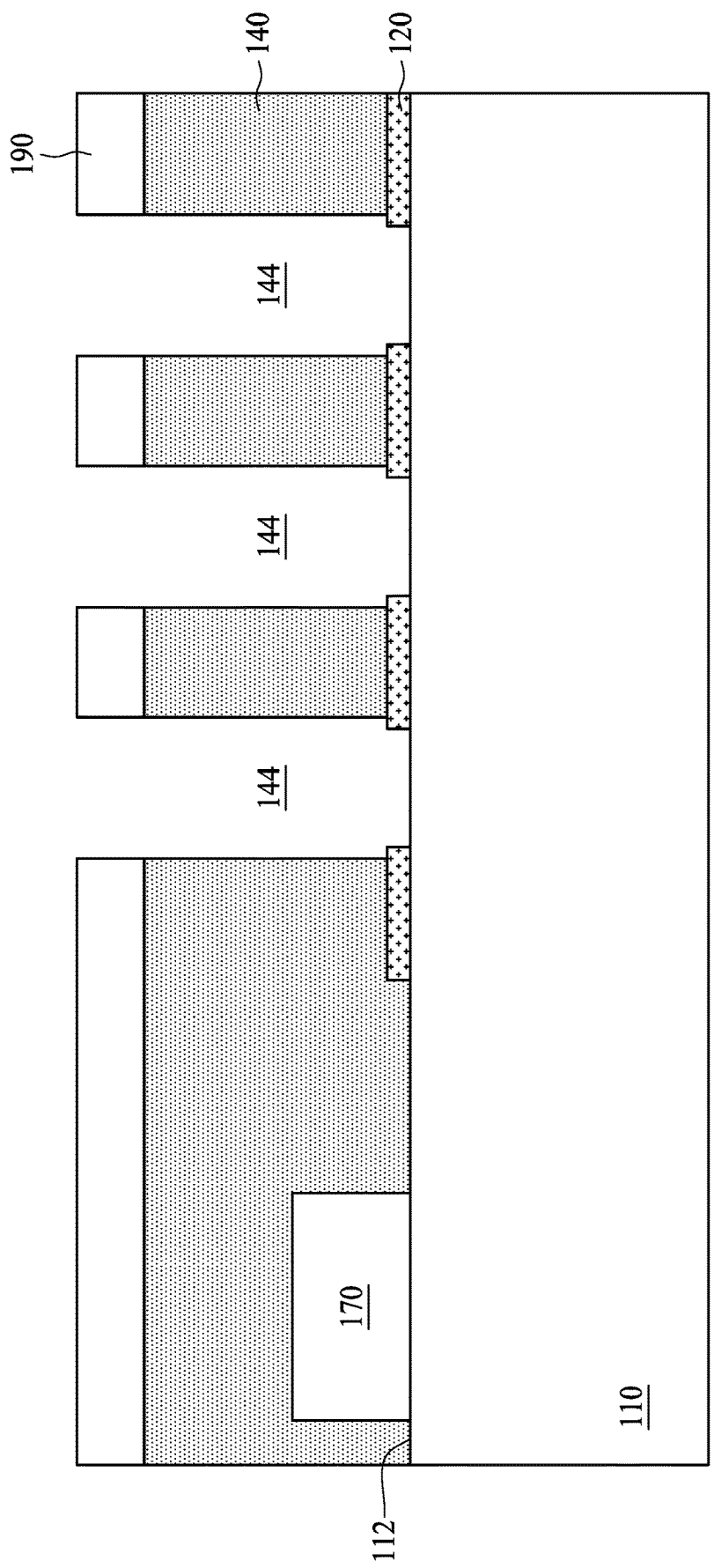

Referring to FIG. 11, in some embodiments, a second patterning process is performed to etch the dielectric layer 140 and thus create a plurality of trenches 144 in the dielectric layer 140 according to a step 318 in FIG. 3. In some embodiments, the trenches 144 are formed by removing the portion of the dielectric layer 140 exposed through the second photoresist layer 190. In some embodiments, portions of the restraint layer 120 and the front surface 112 are exposed to the trenches 144. In some embodiments, the dielectric layer 140 is patterned using a dry etching process. In some embodiments, the dielectric layer 140 is etched with a high selectivity with respect to the etching of the restraint layer 120, using a self-aligned contact (SAC) etching process.

Figure 12:
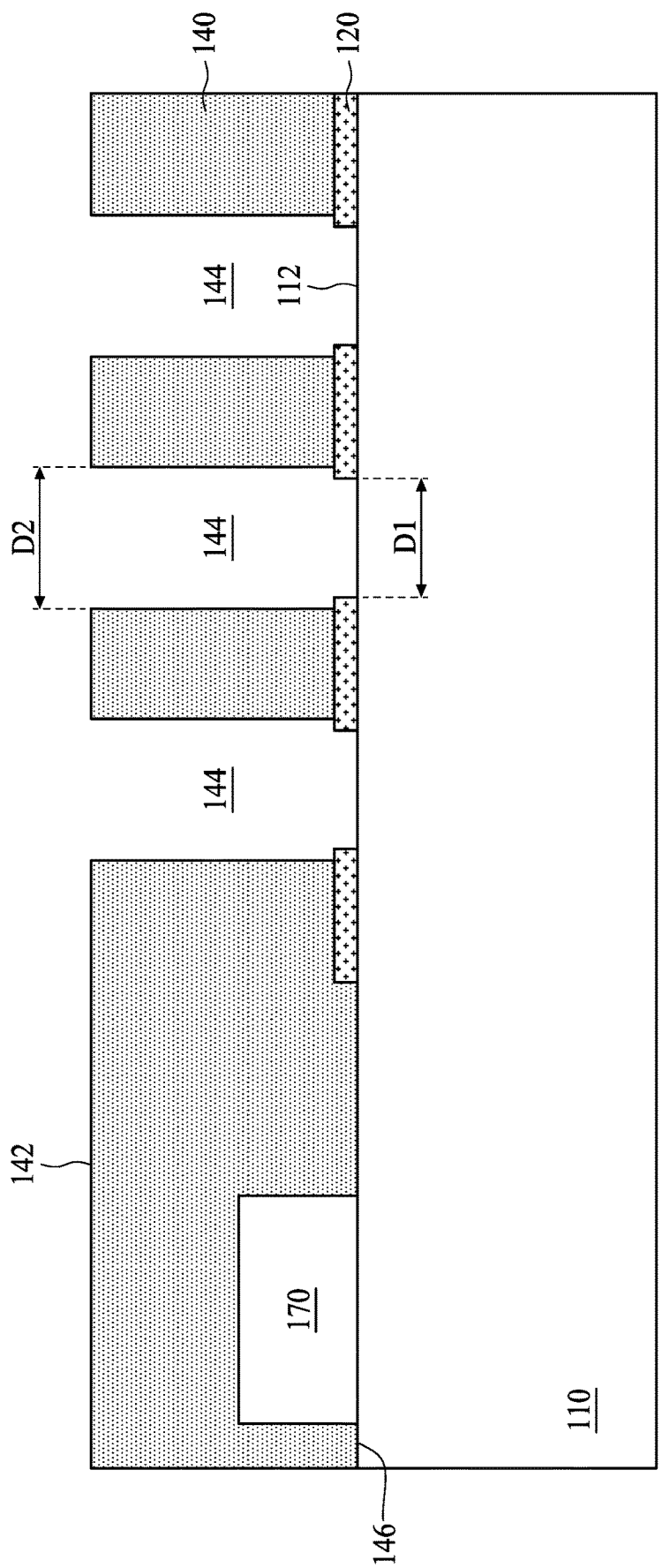

Referring to FIG. 12, the remaining second photoresist layer 190 is then removed, for example, through an ashing process according to a step 320 in FIG. 3. In some embodiments, the trenches 144 extend from the upper surface 142 to a lower surface 146 opposite to the upper surface 142. In some embodiments, a portion of the front surface 112 is exposed to the trenches 144. In some embodiments, each of the trenches 144 has an aperture D2, which is greater than the aperture D1 of the openings 122 formed in the restraint layer 120.

Figure 13:
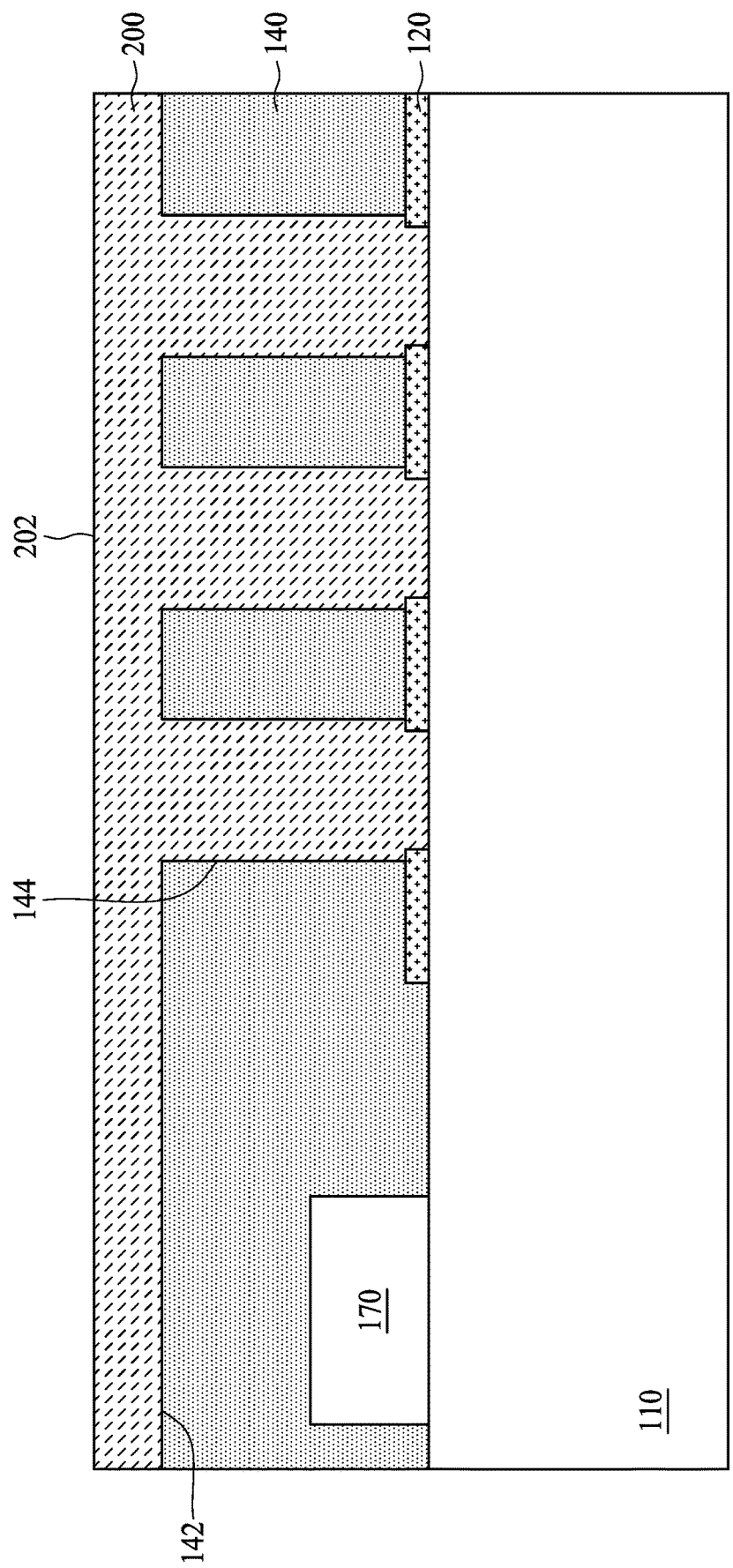

Referring to FIG. 13, in some embodiments, a first conductive material 200 is deposited on the dielectric layer 140 and in the trenches 144 according to a step 322 in FIG. 3. In some embodiments, the first conductive material 200 may extend over the upper surface 142. In some embodiments, the first conductive material 200 is deposited in the trenches 144 until a top surface 202 of the first conductive material 200 is higher than the upper surface 142. In some embodiments, the first conductive material 200 includes tungsten. In some embodiments, the first conductive material 200 is formed using a CVD process, for example.

Figure 14:
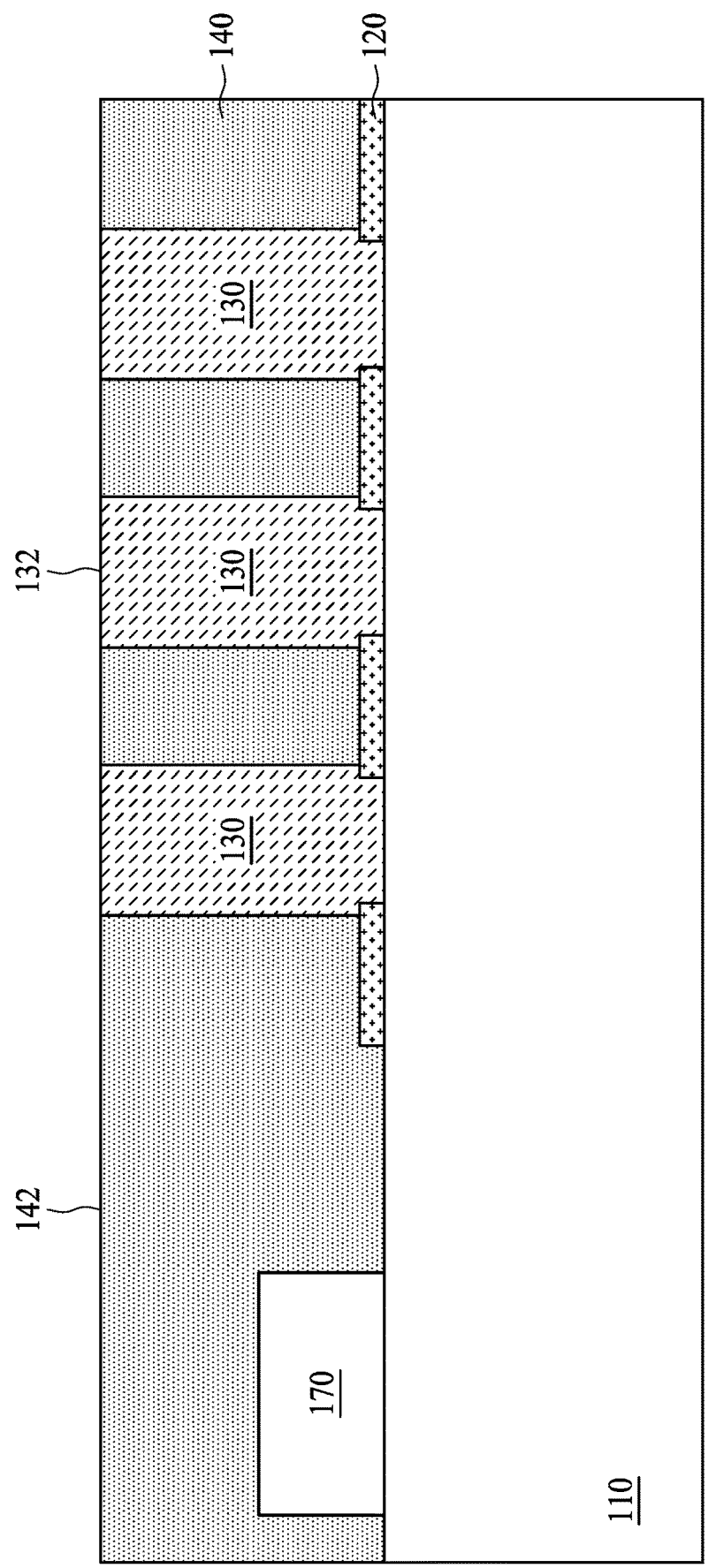

Referring to FIG. 14, in some embodiments, a first planarizing process is performed to expose the dielectric layer 140 according to a step 324 in FIG. 3. Accordingly, a plurality of contact plugs 130 are formed. In some embodiments, an end surface 132 of each of the contact plugs 130 is coplanar with the upper surface 142 of the dielectric layer 140. In some embodiments, the first planarizing process is, for example, a chemical mechanical polish (CMP) process.

Figure 15:
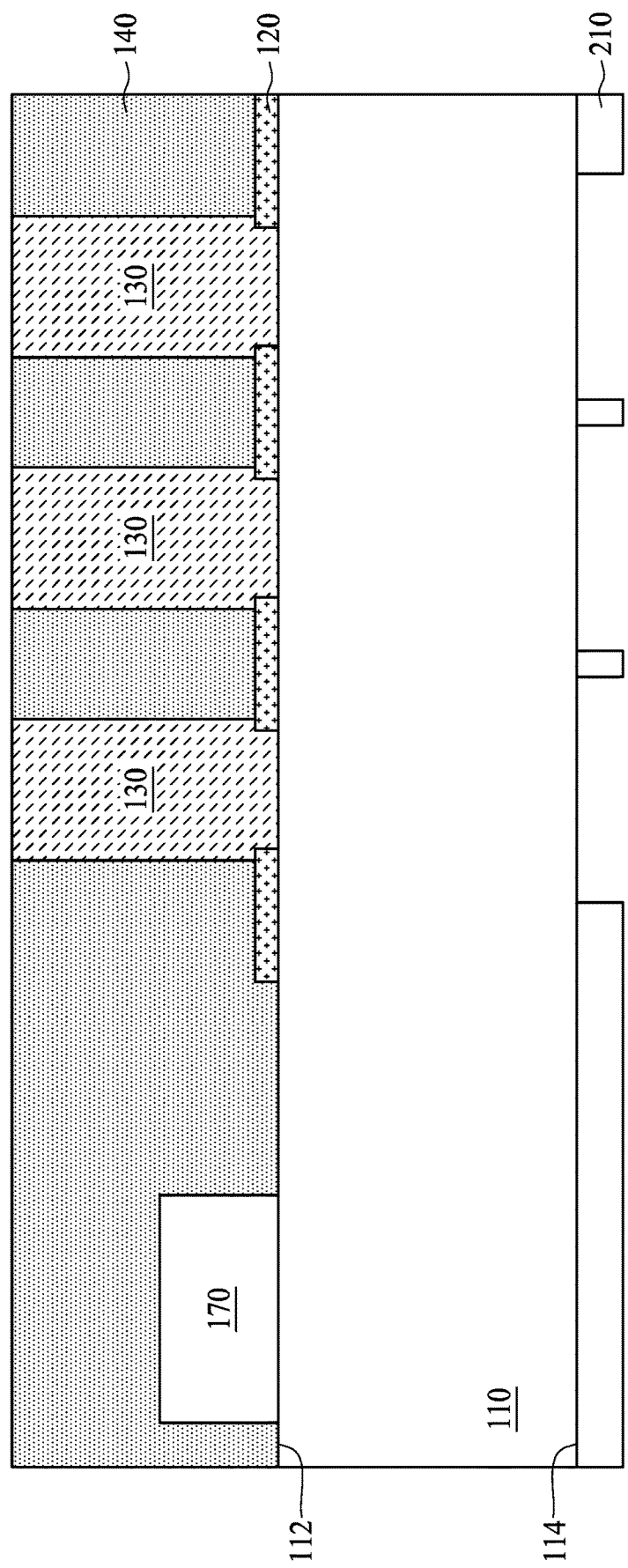

Referring to FIG. 15, in some embodiments, a third photoresist layer 210 is formed on a back surface 114, opposite to the front surface 112, of the semiconductor substrate 110 according to a step 326 in FIG. 3. The third photoresist layer 210 is then patterned to expose portions of the back surface 114. In some embodiments, the exposed portions of the back surface 114 correspond to positions where the contact plugs 130 are formed.

Figure 16:
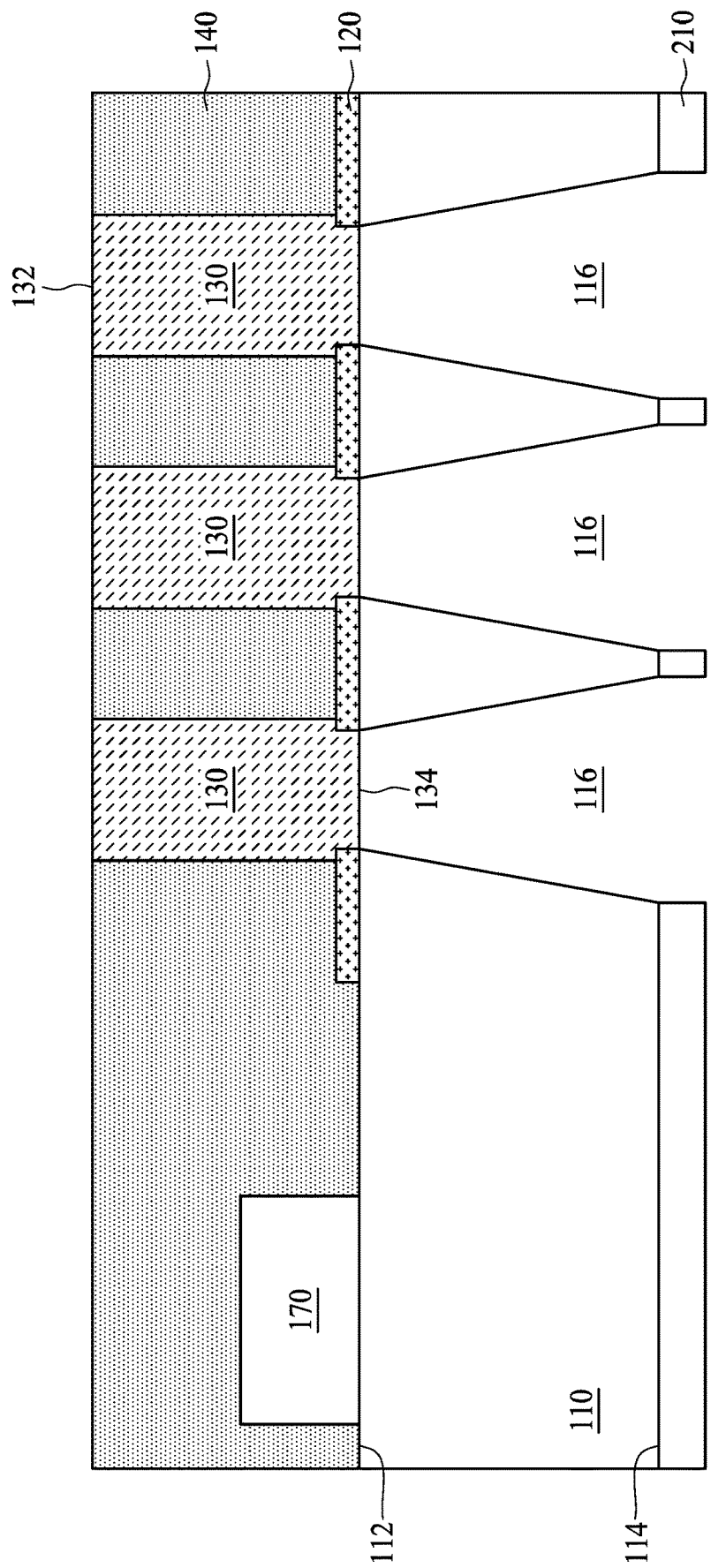

Referring to FIG. 16, in some embodiments, a third patterning process is performed to etch the semiconductor substrate 110 and thus create a plurality of through-holes 116 in the semiconductor substrate 110 according to a step 328 in FIG. 3. In some embodiments, the through-holes 116 stop at the contact plugs 130 (and the restraint layer 120). In some embodiments, each of the through-holes 116 extends from the back surface 114 to the front surface 112 of the semiconductor substrate 110. In some embodiments, end surfaces 134 of the contact plugs 130 are exposed to the through-holes 116.

Figure 17:
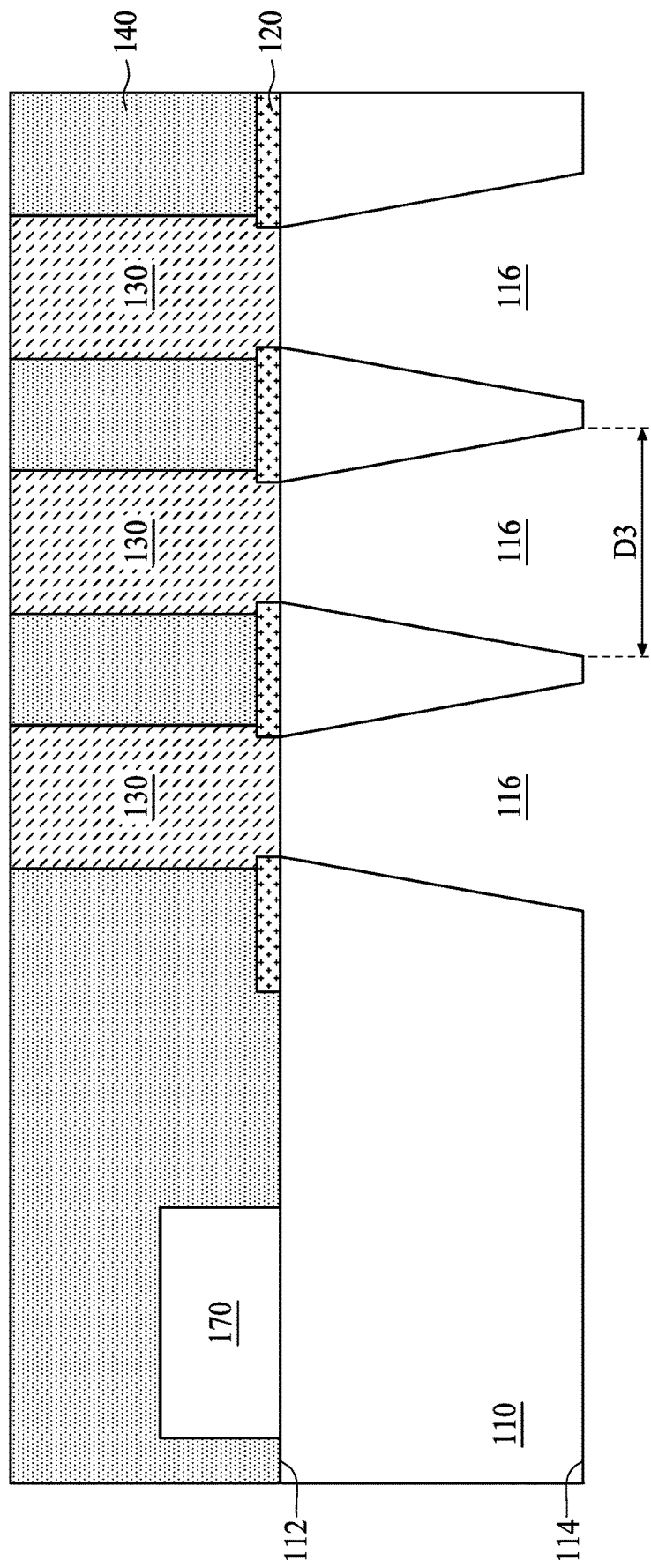

Referring to FIG. 17, in some embodiments, the remaining third photoresist layer 210 is then removed, for example, through an ashing process according to a step 330 in FIG. 3. In some embodiments, each of the through-holes 116 has an aperture D3, which gradually increases at positions of increasing distance from the contact plugs 130.

Figure 18:
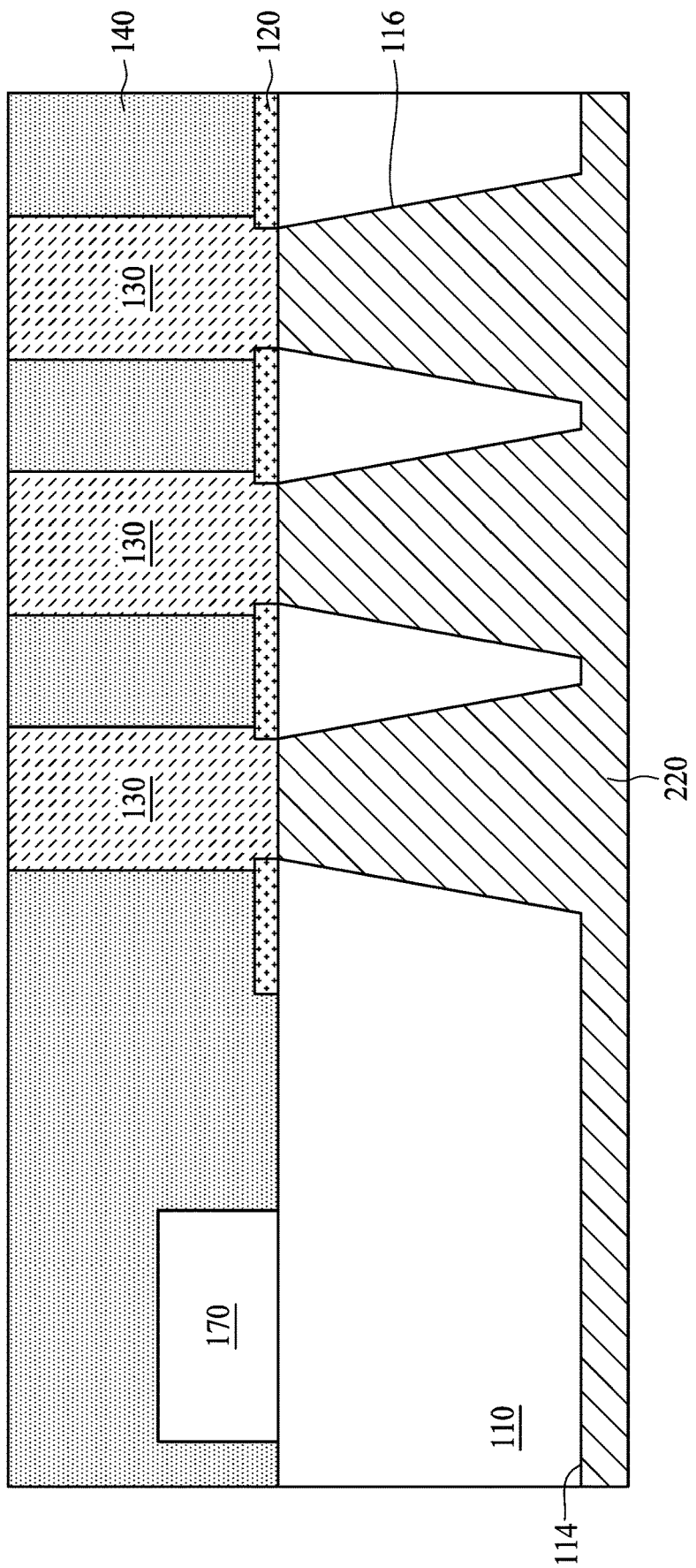

Referring to FIG. 18, in some embodiments, a second conductive material 220 is deposited in the through-holes 116 according to a step 334 in FIG. 3. In some embodiments, the second conductive material 220 extends along the back surface 114 and into the through-holes 116. In some embodiments, the second conductive material 220 includes copper or a copper alloy, although other types of conductive materials, including aluminum, silver, gold, tungsten, or a combination thereof, may also be used. In some embodiments, the formation methods of the second conductive material 220 include a plating process (such as an electroplating process), a CVD process, a physical vapor deposition (PVD) process or a sputtering process.

Figure 19:
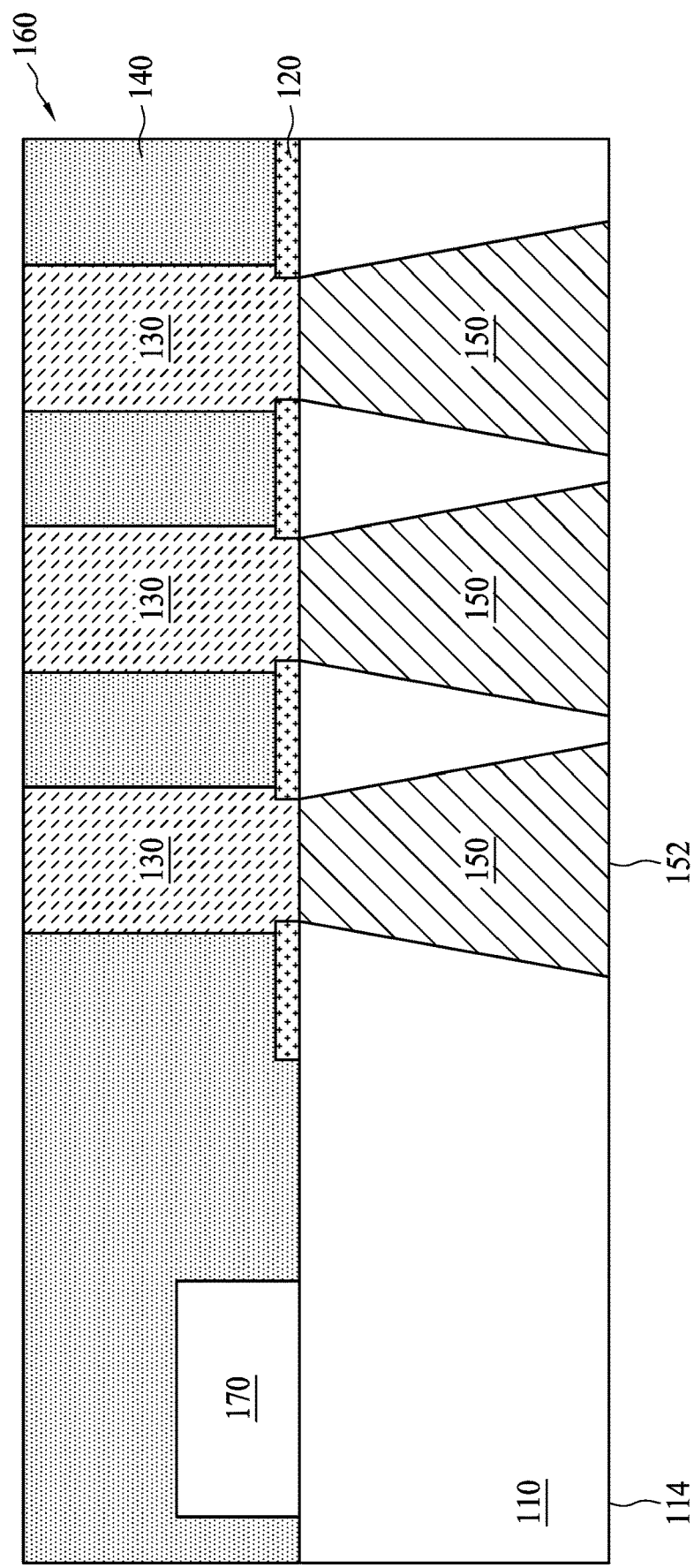

Referring to FIG. 19, in some embodiments, a second planarizing process is performed to expose the semiconductor substrate 110 according to a step 336 in FIG. 3. Accordingly, a plurality of through silicon vias 150 are formed, and hence the interconnection structure 160 is completely formed. In the resulting structure, an end surface 152 of each of the through silicon vias 150 is coplanar with the back surface 114 of the semiconductor substrate 110. In some embodiments, the through silicon vias 150 are in contact with the contact plugs 130, respectively. In some embodiments, the second planarizing process is, for example, a CIVIP process.

FIGS. 20 through 27 illustrate the formation of semiconductor devices 10A and 10B in accordance with alternative embodiments. Unless specified otherwise, the materials and formation methods of the components in these embodiments are essentially the same as those of the like components, which are denoted by like reference numerals in the embodiments shown in FIGS. 4 through 19. The details of the like components shown in FIGS. 20 through 27 may thus be found in the discussion of the embodiments shown in FIGS. 4 through 19.

Figure 20:
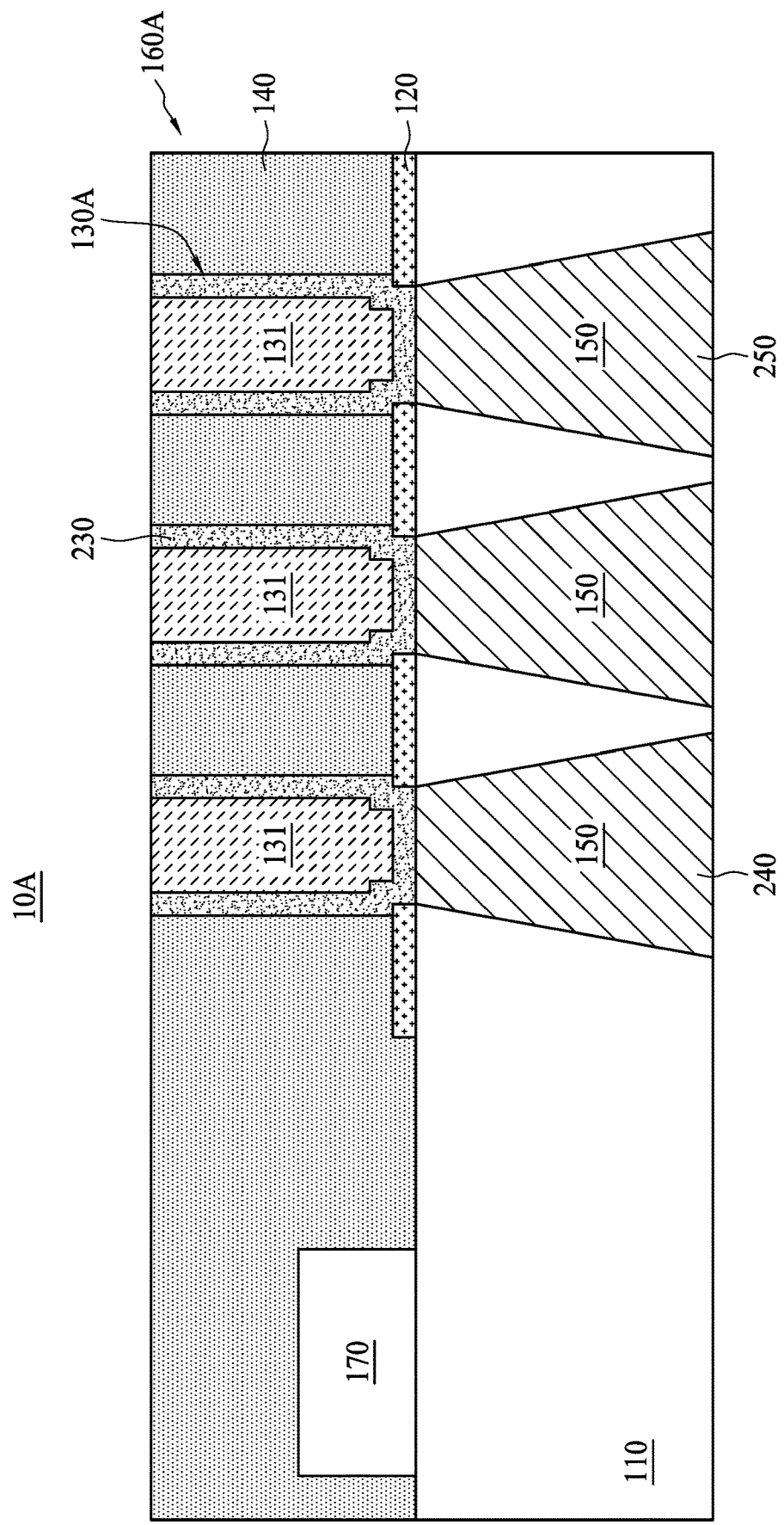
FIG. 20 is a cross-sectional view of a semiconductor device in accordance with some alternative embodiments of the present disclosure.
Figure 21:
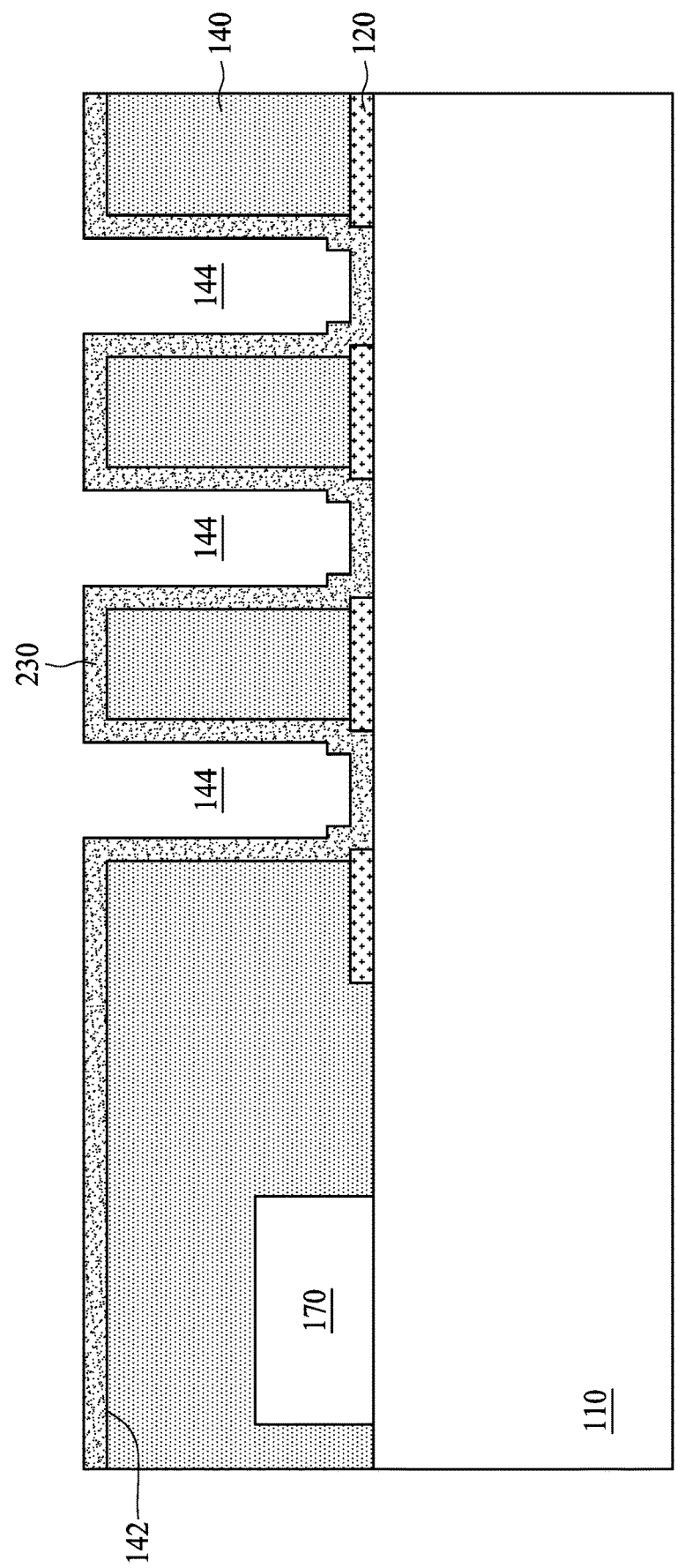
FIGS. 21 through 23 illustrate cross-sectional views of intermediate stages in the formation of a semiconductor device in accordance with some alternative embodiments of the present disclosure.
Figure 22:
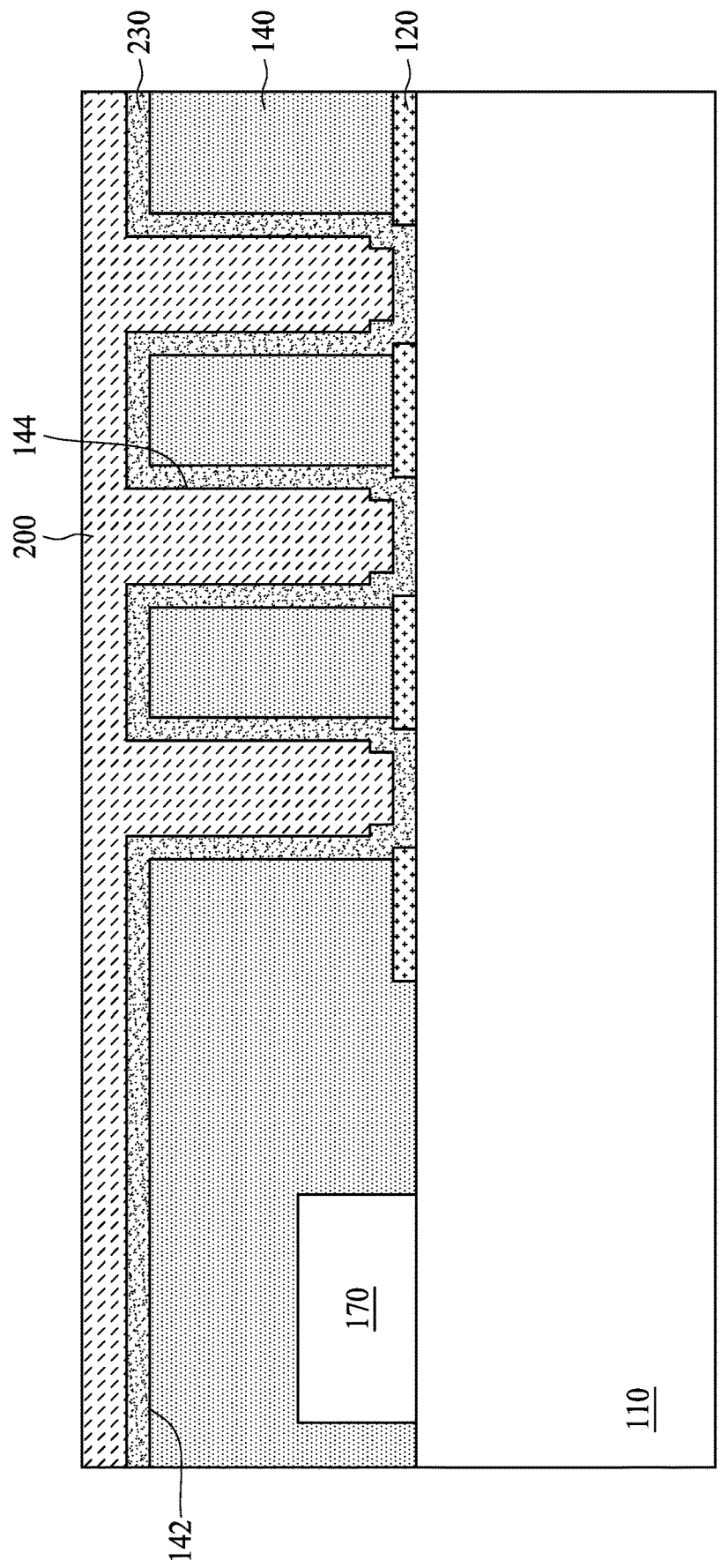
Figure 23:
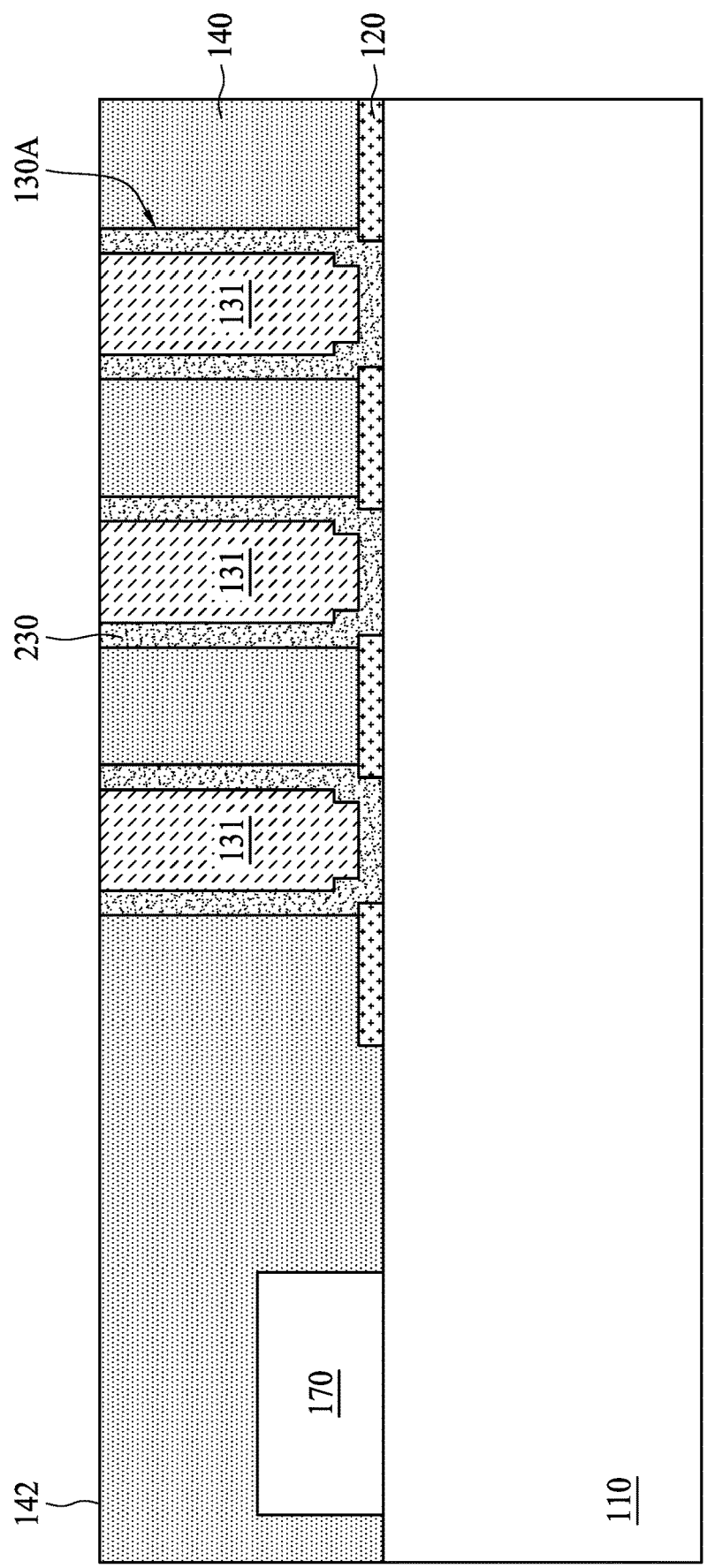

Referring to FIG. 20, in some embodiments, an interconnection structure 160A of the semiconductor device 10A includes a plurality of contact plugs 130A in contact with the through silicon vias 150, respectively. Each of the contact plugs 130A includes a first conductive plug 131 disposed in the dielectric layer 140 and a first barrier layer 230 disposed between the first conductive plug 131 and the dielectric layer 140. The formation process of the semiconductor device 10A is similar to the process for forming the semiconductor device 10 shown in FIG. 19, except the formation of the semiconductor device 10A is started after the trenches 144 are formed, and before the through silicon vias 150 are formed. For example, FIGS. 21 through 23 illustrate cross-sectional views of intermediate stages in the formation of the semiconductor device 10A shown in FIG. 20. In these exemplary embodiments, after formation of the trenches 144, the first barrier layer 230 is deposited on the dielectric layer 140 and in the trenches 144 according to a step 321 in FIG. 3.

In some embodiments, the first barrier layer 230 extends along the upper surface 142 of the dielectric layer 140 and into the trenches 144. In some embodiments, the first barrier layer 230 has a uniform thickness. In some embodiments, the first barrier layer 230 is a substantially conformal layer. In some embodiments, the first barrier layer 230 may improve adhesion of a first conductive material 200, which will be formed during a subsequent process, to the dielectric layer 140. In some embodiments, refractory metals, refractory metal nitrides, refractory metal silicon nitrides and combinations thereof are typically used for the first barrier layer 230. In some embodiments, the first barrier layer 230 may include titanium (Ti), titanium nitride (TiN), tantalum (Ta), tantalum nitride (TaN), titanium silicon nitride (TiSN), tantalum silicon nitride (TaSiN), or the like. In some embodiments, the first barrier layer 230 is formed using a PVD process, for example.

Referring to FIG. 22, the first conductive material 200 is deposited on the first barrier layer 230 according to a step 322 in FIG. 3. In some embodiments, the first conductive material 200 fills the trenches 144 surrounded by the first barrier layer 230. The process steps and the material for forming the first conductive material 200 may be found by referring to the embodiments shown in FIG. 13. In some embodiments, a first planarizing process is then performed according to a step 324 in FIG. 3, and hence the first conductive plugs 131 and the contact plugs 130A are formed as shown in FIG. 23. In some embodiments, the first barrier layer 230 and the first conductive material 200 above the upper surface 142 are removed during the first planarizing process. Next, as shown in FIG. 20, the through silicon vias 150 are formed in the semiconductor substrate 110 and in contact with the contact plugs 130, respectively, and hence an interconnection structure 160A is formed.

Figure 24:
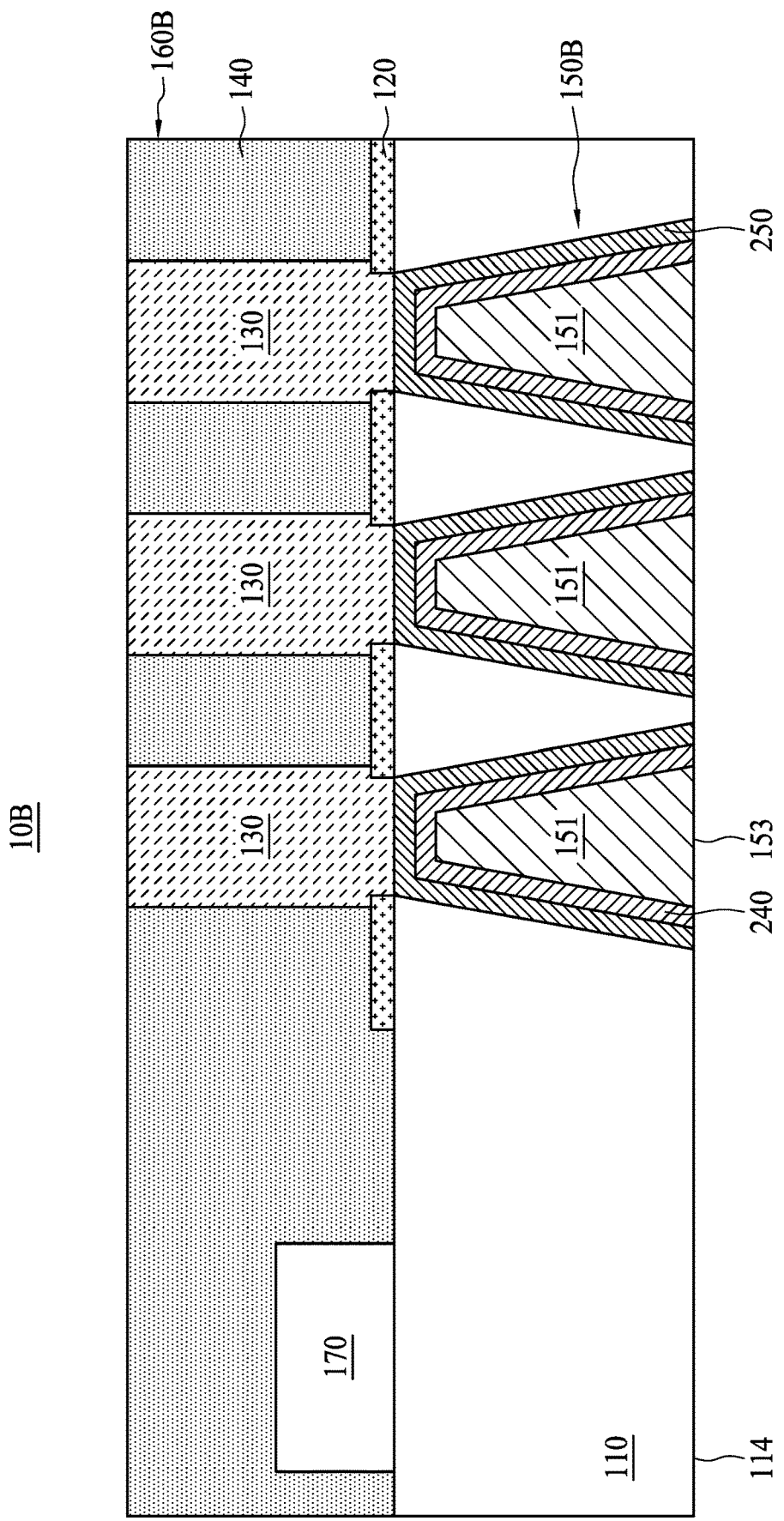
FIG. 24 is a cross-sectional view of a semiconductor device in accordance with other alternative embodiments of the present disclosure.

FIG. 24 is a cross-sectional view of a semiconductor device 10B in accordance with other alternative embodiments of the present disclosure. Referring to FIG. 24, in some embodiments, an interconnection structure 160B of the semiconductor device 10B includes a plurality of through silicon vias 150B in contact with the contact plugs 130, respectively. In some embodiments, each of the through silicon vias 150B includes a second conductive plug 151 disposed in the semiconductor substrate 110, a seed layer 240 encircling the second conductive plug 151, and a second barrier layer 250 disposed between the seed layer 240 and the semiconductor substrate 110.

Figure 25:
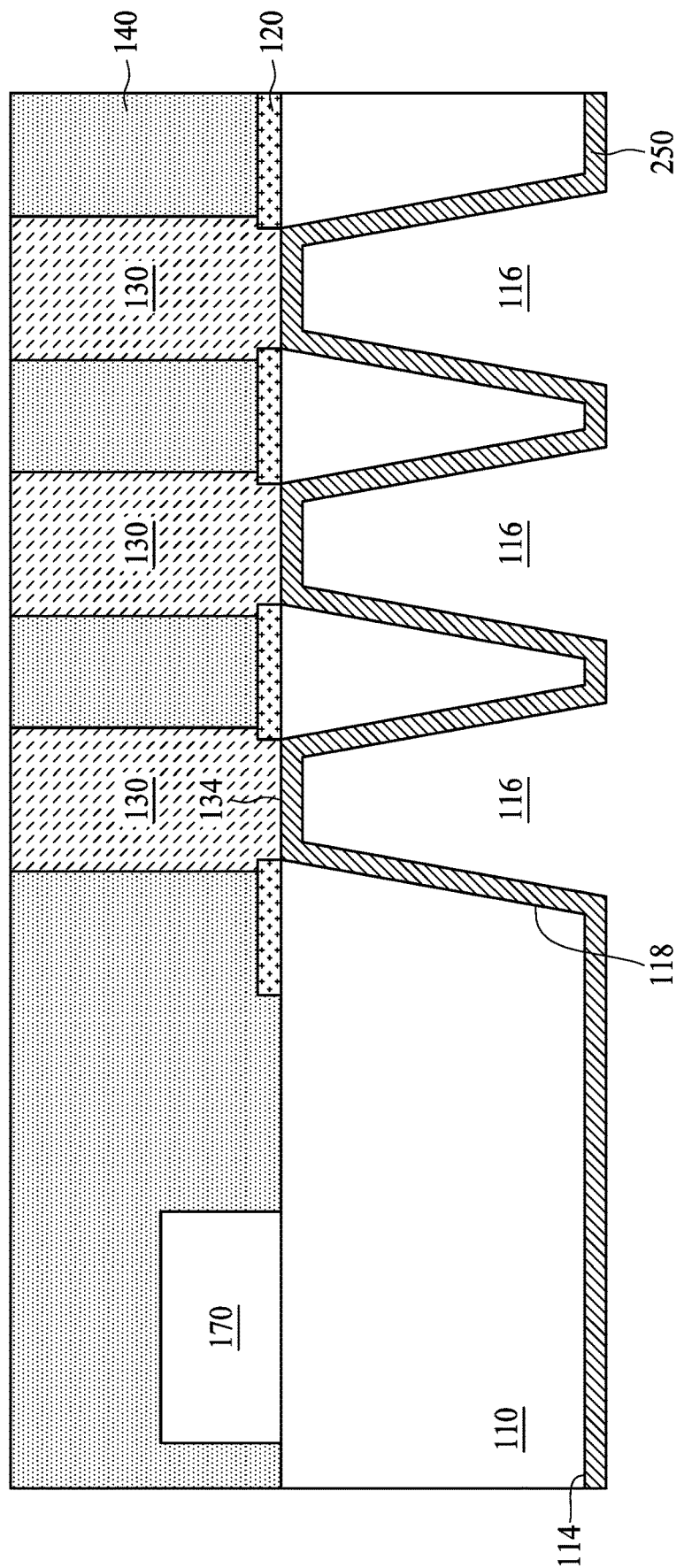
FIGS. 25 to 27 illustrate cross-sectional views of intermediate stages in the formation of the semiconductor device in accordance with other alternative embodiments of the present disclosure.
Figure 26:
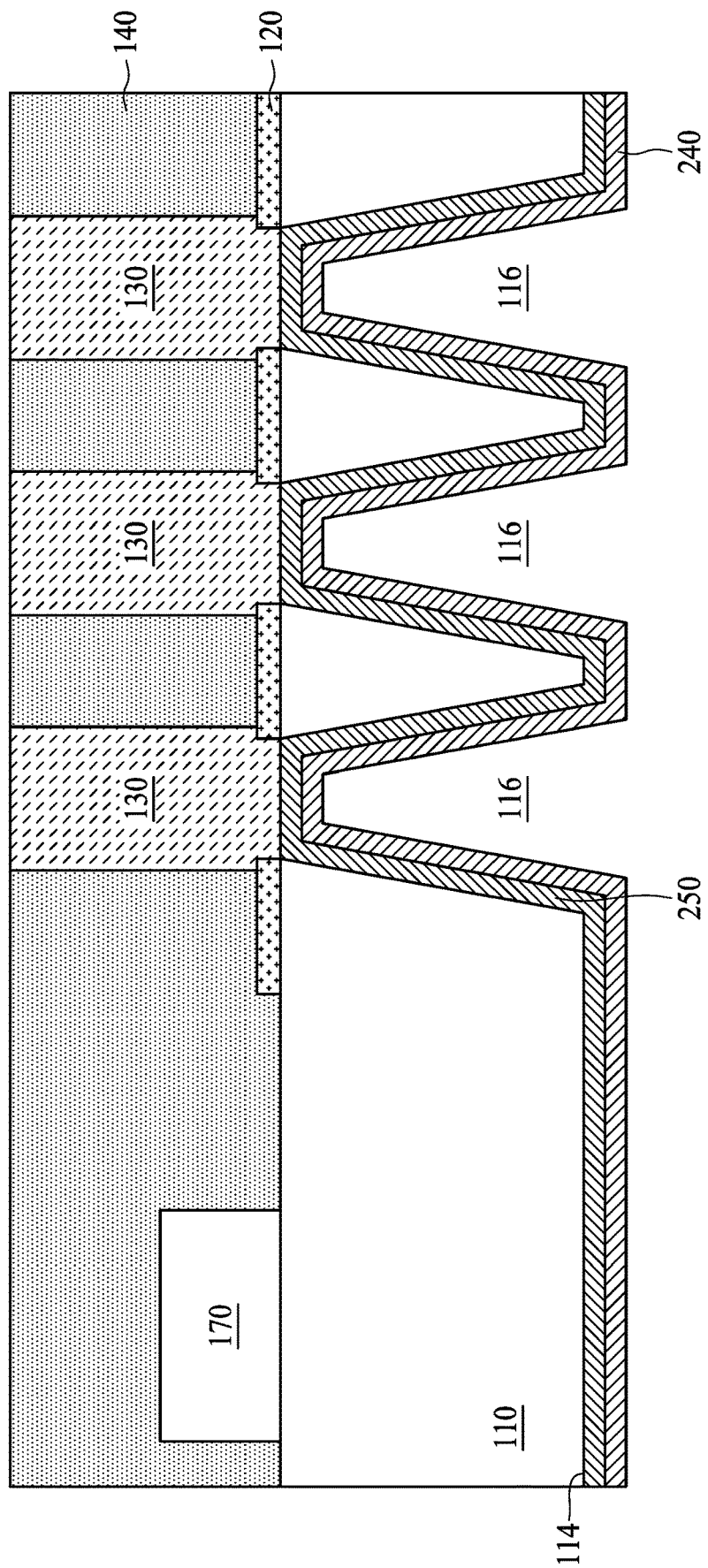
Figure 27:
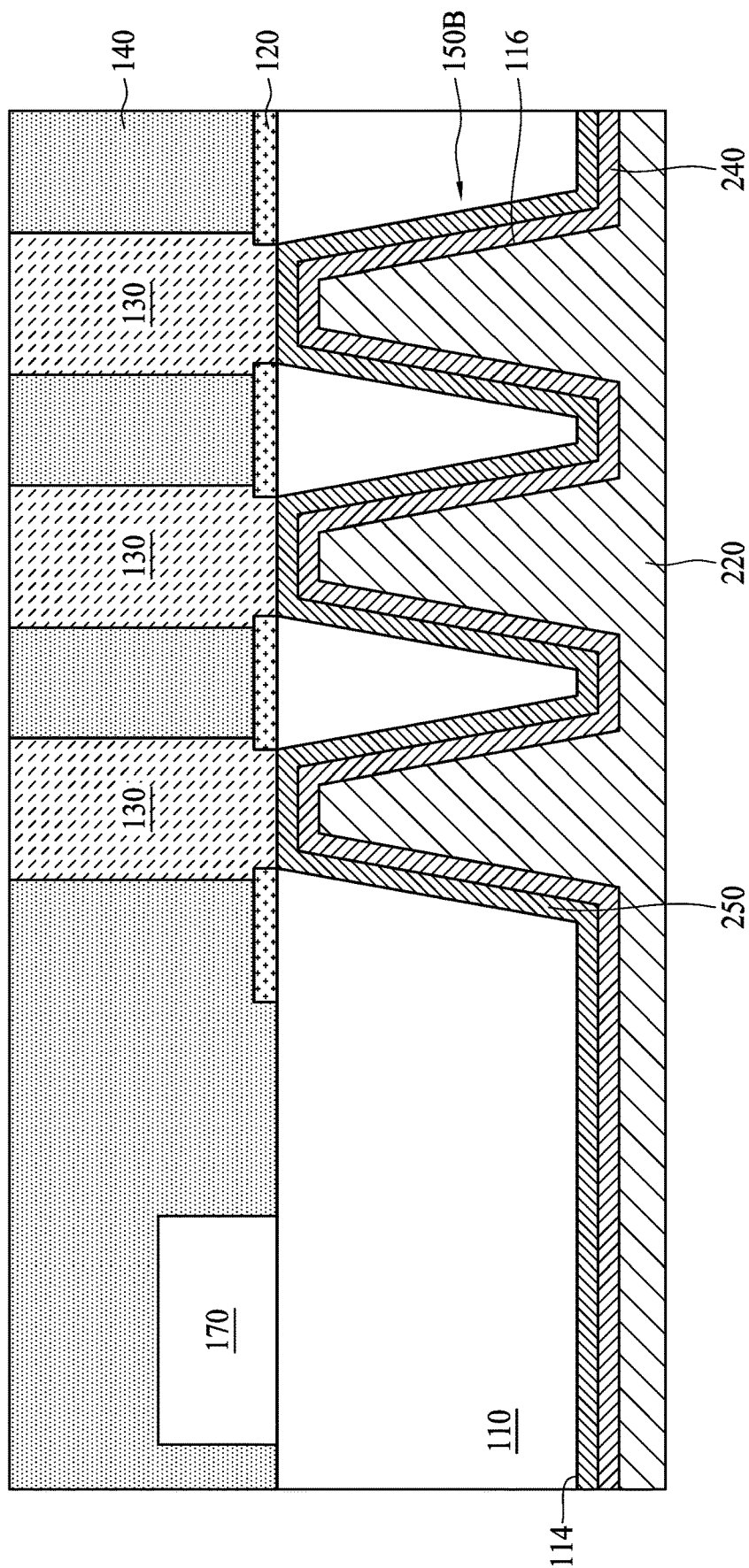

The formation process of the semiconductor device 10B is similar to the process for forming the semiconductor device 10 shown in FIG. 19, except the formation of the semiconductor device 10B is started after the through-holes 116 are formed. For example, FIGS. 25 through 27 illustrate cross-sectional views of intermediate stages in the formation of the semiconductor device 10B. Referring to FIG. 25, in some embodiments, after the formation of the through-holes 116, the second barrier layer 250 is deposited to extend along the back surface 114 and into the through-holes 116 according to a step 331 in FIG. 3. In some embodiments, the second barrier layer 250 is blanket formed to cover the back surface 114, sidewalls 118 of the semiconductor substrate 110, and the end surfaces 134 of the contact plugs 130. In some embodiments, the second barrier layer 250 acts as a glue layer. In some embodiments, the second barrier layer 250 is a substantially conformal layer. In some embodiments, the second barrier layer 250 may include titanium, titanium nitride, tantalum, tantalum nitride, and combinations thereof, and can be formed using a PVD process, for example.

Referring to FIG. 26, in some embodiments, a seed layer 240 is optionally disposed on the second barrier layer 250 according to a step 332 in FIG. 3. In some embodiments, the seed layer 240 may be blanket formed on the second barrier layer 250. In some embodiments, the seed layer 240 has a uniform thickness. In some embodiments, the seed layer 240 includes copper or copper alloys, and metals such as tungsten, silver, gold, aluminum, and combinations thereof may also be included. In some embodiments, the seed layer 240 is formed through a PVD process. In other embodiments, other methods such as electro plating or electro-less plating may be used.

Referring to FIG. 27, a second conductive material 220 is deposited to fill the through-holes 116 surrounded by the seed layer 240 according to a step 334 in FIG. 3. The process steps and the material for forming the second conductive material 220 may be found by referring to the embodiments shown in FIG. 18. In some embodiments, a second CMP process is then performed to remove portions of the second conductive material 220, the seed layer 240, and the second barrier layer 250 to form a plurality of conductive plugs 151 according to a step 336 in FIG. 3, and hence the interconnection structure 160B is formed as shown in FIG. 24. In the resulting structure, an end surface 153 of each of the conductive plugs 151 is coplanar with the back surface 114.

In conclusion, with the formation process of the semiconductor device 10/10A/10B, the through silicon vias 150/150B are easily aligned with the contact plugs 130/130A, respectively, and thus a problem of connection mismatch between the through silicon vias 150/150B and the contact plugs 130/130A is prevented.

One aspect of the present disclosure provides a semiconductor device. The semiconductor device includes a semiconductor substrate, a restraint layer, a plurality of contact plugs, and a plurality of through silicon vias. The restraint layer is disposed on the semiconductor substrate, and the contact plugs are inserted into the restraint layer. The through silicon vias extend from a bottom surface of the semiconductor substrate to a front surface opposite to the back surface. The through silicon vias are in contact with the contact plugs, respectively.

One aspect of the present disclosure provides a method of manufacturing a semiconductor device. The method includes steps of providing a semiconductor substrate; disposing a restraint layer on the semiconductor substrate; forming a plurality of openings in the restraint layer to expose the semiconductor substrate; disposing a dielectric layer on the restraint layer and in the openings; forming a plurality of trenches in the dielectric layer to expose the semiconductor substrate; depositing a first conductive material in the trenches; forming a plurality of through-holes in the semiconductor substrate to expose the first conductive material; and depositing a second conductive material in the through-holes.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a semiconductor substrate;
   a restraint layer disposed on the semiconductor substrate;
   a plurality of contact plugs inserted into the restraint layer; and
   a plurality of through silicon vias extending from a bottom surface of the semiconductor substrate to a front surface opposite to a back surface, wherein the through silicon vias are in contact with the contact plugs, respectively;
   wherein each of the plurality of contact plugs includes a lower portion encircled by the restraint layer and directly coupled to one of the plurality of through silicon vias and an upper portion located above the lower portion and not encircled by the restraint layer, and a width of the lower portion is smaller than a width of the upper portion.

2. The semiconductor device of claim 1, wherein an aperture of each of the plurality of through silicon vias gradually increases at positions of increasing distance from the contact plugs.

3. The semiconductor device of claim 1, further comprising a dielectric layer encircling the upper portion of each of the plurality of contact plugs.

4. The semiconductor device of claim 3, wherein a top surface of the upper portion of each of the plurality of contact plugs is coplanar with an upper surface of the dielectric layer.

5. The semiconductor device of claim 3, further comprising a semiconductor component disposed on the semiconductor substrate and surrounded by the dielectric layer.

6. The semiconductor device of claim 3, wherein each of the plurality of contact plugs comprises:
   a first conductive plug disposed in the dielectric layer; and
   a first barrier layer disposed between the first conductive plug and the dielectric layer.

7. The semiconductor device of claim 1, wherein each of the plurality of through silicon vias comprises:
   a second conductive plug disposed in the semiconductor substrate; and
   a second barrier layer disposed between the semiconductor substrate and the second conductive plug.

8. The semiconductor device of claim 7, wherein each of the plurality of through silicon vias further comprises a seed layer disposed between the second barrier layer and the second conductive plug.

9. The semiconductor device of claim 1, wherein an end surface of each of the plurality of through silicon vias is coplanar with the back surface.

* * * * *